(12) United States Patent
Kurtin et al.

(10) Patent No.: US 11,205,741 B2
(45) Date of Patent: Dec. 21, 2021

(54) METHOD FOR FORMING A COMPOSITE HAVING SEMICONDUCTOR STRUCTURES INCLUDING A NANOCRYSTALLINE CORE AND SHELL EMBEDDED IN A MATRIX

(71) Applicant: OSRAM Opto Semiconductors GmbH, Regensburg (DE)

(72) Inventors: Juanita Kurtin, Hillsboro, OR (US);
Brian Theobald, Gladstone, OR (US);
Matthew J. Carillo, Portland, OR (US); Oun-Ho Park, San Jose, CA (US); Georgeta Masson, Lafayette, CA (US); Steven M. Hughes, Salem, VA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/052,515

(22) Filed: Aug. 1, 2018

(65) Prior Publication Data
US 2018/0342652 A1 Nov. 29, 2018

Related U.S. Application Data

(60) Division of application No. 15/004,478, filed on Jan. 22, 2016, now Pat. No. 10,074,780, which is a
(Continued)

(51) Int. Cl.
*H01L 33/50* (2010.01)
*C09K 11/02* (2006.01)
(Continued)

(52) U.S. Cl.
CPC ............ *H01L 33/502* (2013.01); *B82Y 30/00* (2013.01); *C01B 19/007* (2013.01); *C09K 11/02* (2013.01);
(Continued)

(58) Field of Classification Search
CPC ..... H01L 33/502; H01L 33/005; H01L 33/06; H01L 33/56; H01L 2933/0083;
(Continued)

(56) References Cited

U.S. PATENT DOCUMENTS

| 4,539,048 A | 9/1985 | Cohen |
| 4,539,049 A | 9/1985 | Cohen |

(Continued)

FOREIGN PATENT DOCUMENTS

| CN | 101425565 A | 5/2009 |
| CN | 101641424 A | 2/2010 |

(Continued)

OTHER PUBLICATIONS

Extended European Search Report for European Patent Application No. 19153485.8, dated Mar. 13, 2019, 7 pages.
(Continued)

*Primary Examiner* — Thao X Le
*Assistant Examiner* — Gardner W. S. Swan
(74) *Attorney, Agent, or Firm* — Elliott, Ostrander & Preston, P.C.

(57) ABSTRACT

Semiconductor structures having a nanocrystalline core and corresponding nanocrystalline shell and insulator coating, wherein the semiconductor structure includes an anisotropic nanocrystalline core composed of a first semiconductor material, and an anisotropic nanocrystalline shell composed of a second, different, semiconductor material surrounding the anisotropic nanocrystalline core. The anisotropic nanocrystalline core and the anisotropic nanocrystalline shell form a quantum dot. An insulator layer encapsulates the nanocrystalline shell and anisotropic nanocrystalline core.

22 Claims, 12 Drawing Sheets

Related U.S. Application Data division of application No. 14/685,570, filed on Apr. 13, 2015, now Pat. No. 9,793,446, which is a continuation of application No. 13/485,762, filed on May 31, 2012, now abandoned.

(60) Provisional application No. 61/558,974, filed on Nov. 11, 2011, provisional application No. 61/558,964, filed on Nov. 11, 2011, provisional application No. 61/557,653, filed on Nov. 9, 2011.

(51) Int. Cl.

| | | |
|---|---|---|
| *C09K 11/56* | (2006.01) | |
| *C09K 11/88* | (2006.01) | |
| *C01B 19/00* | (2006.01) | |
| *B82Y 30/00* | (2011.01) | |
| *H01L 33/00* | (2010.01) | |
| *H01L 33/06* | (2010.01) | |
| *H01L 33/56* | (2010.01) | |
| *B82Y 40/00* | (2011.01) | |
| *B82Y 20/00* | (2011.01) | |

(52) U.S. Cl.
CPC .......... *C09K 11/025* (2013.01); *C09K 11/565* (2013.01); *C09K 11/883* (2013.01); *H01L 33/005* (2013.01); *H01L 33/06* (2013.01); *H01L 33/56* (2013.01); *H05K 999/99* (2013.01); *B82Y 20/00* (2013.01); *B82Y 40/00* (2013.01); *C01P 2002/84* (2013.01); *C01P 2004/04* (2013.01); *C01P 2004/10* (2013.01); *C01P 2004/54* (2013.01); *C01P 2004/64* (2013.01); *C01P 2004/80* (2013.01); *H01L 2933/005* (2013.01); *H01L 2933/0033* (2013.01); *H01L 2933/0041* (2013.01); *H01L 2933/0083* (2013.01); *Y10S 977/744* (2013.01); *Y10S 977/774* (2013.01); *Y10S 977/824* (2013.01); *Y10S 977/89* (2013.01); *Y10S 977/95* (2013.01)

(58) Field of Classification Search
CPC ...... H05K 999/99; B82Y 30/00; B82Y 20/00; B82Y 40/00; C01B 19/007; C09K 11/883; C09K 11/565; C09K 11/025; C09K 11/02; Y10S 977/824; Y10S 977/744; Y10S 977/774; Y10S 977/89; Y10S 977/95
See application file for complete search history.

(56) References Cited

U.S. PATENT DOCUMENTS

| | | | |
|---|---|---|---|
| 5,238,671 A | 8/1993 | Matson et al. | |
| 5,849,811 A | 12/1998 | Nicolson et al. | |
| 6,225,198 B1 | 5/2001 | Alivisatos | |
| 6,235,864 B1 | 5/2001 | Loy et al. | |
| 6,268,222 B1 | 7/2001 | Chandler et al. | |
| 6,322,901 B1 | 11/2001 | Bawendi et al. | |
| 6,329,058 B1 | 12/2001 | Arney et al. | |
| 6,656,990 B2 | 12/2003 | Shustack | |
| 6,744,065 B1 | 6/2004 | Samuelson et al. | |
| 7,264,527 B2 | 9/2007 | Bawendi et al. | |
| 7,394,094 B2 | 7/2008 | Halper et al. | |
| 7,402,832 B2 | 7/2008 | Lee | |
| 7,405,002 B2 | 7/2008 | Ying et al. | |
| 7,515,333 B1 | 4/2009 | Empedocles | |
| 7,560,859 B2 | 7/2009 | Saito et al. | |
| 7,645,397 B2 | 1/2010 | Parce et al. | |
| 7,776,630 B1 | 8/2010 | Kar et al. | |
| 7,824,731 B2 | 11/2010 | Ying et al. | |
| 7,933,022 B2 | 4/2011 | Smith et al. | |
| 8,062,703 B2 | 11/2011 | O'Brien et al. | |
| 8,178,202 B2 | 5/2012 | Halas et al. | |
| 8,399,751 B2 | 3/2013 | Lu et al. | |
| 8,404,154 B2 | 3/2013 | Breen et al. | |
| 8,889,457 B2 | 11/2014 | Kurtin et al. | |
| 9,153,734 B2 | 10/2015 | Kurtin et al. | |
| 9,159,872 B2 | 10/2015 | Kurtin et al. | |
| 9,267,889 B1 | 2/2016 | Klopfer et al. | |
| 9,368,693 B2 | 6/2016 | Kurtin | |
| 9,425,365 B2 | 8/2016 | Kurtin | |
| 9,428,691 B2 | 8/2016 | Kurtin | |
| 9,525,092 B2 | 12/2016 | Mayer et al. | |
| 9,732,274 B2 | 8/2017 | Mangum et al. | |
| 9,793,446 B2 | 10/2017 | Kurtin et al. | |
| 9,831,397 B2 | 11/2017 | Theobald et al. | |
| 9,957,442 B2 * | 5/2018 | Banin ................. | C09K 11/025 |
| 10,074,780 B2 | 9/2018 | Kurtin et al. | |
| 10,396,228 B2 | 8/2019 | Mayer et al. | |
| 2002/0036009 A1 | 3/2002 | Kyoda et al. | |
| 2003/0060547 A1 | 3/2003 | Chan et al. | |
| 2003/0066998 A1 | 4/2003 | Lee | |
| 2003/0124564 A1 | 7/2003 | Trau et al. | |
| 2003/0214699 A1 | 11/2003 | Banin et al. | |
| 2004/0095658 A1 | 5/2004 | Buretea et al. | |
| 2004/0118448 A1 | 6/2004 | Scher et al. | |
| 2004/0151898 A1 | 8/2004 | Reiss et al. | |
| 2004/0204556 A1 | 10/2004 | Matyjaszewski et al. | |
| 2005/0017260 A1 | 1/2005 | Lee | |
| 2005/0049381 A1 | 3/2005 | Yamashiro et al. | |
| 2005/0117868 A1 | 6/2005 | Chen et al. | |
| 2005/0214536 A1 | 9/2005 | Schrier et al. | |
| 2005/0230673 A1 | 10/2005 | Mueller et al. | |
| 2005/0270350 A1 | 12/2005 | Vincent et al. | |
| 2006/0029802 A1 | 3/2006 | Ying et al. | |
| 2006/0054863 A1 | 3/2006 | Dai et al. | |
| 2006/0068154 A1 | 3/2006 | Parce et al. | |
| 2006/0083694 A1 | 4/2006 | Kodas et al. | |
| 2006/0088713 A1 | 4/2006 | Dykstra et al. | |
| 2006/0158089 A1 | 7/2006 | Saito et al. | |
| 2006/0236918 A1 | 10/2006 | Jun et al. | |
| 2006/0245971 A1 | 11/2006 | Burns et al. | |
| 2007/0059705 A1 | 3/2007 | Lu et al. | |
| 2007/0087195 A1 | 4/2007 | Meyer et al. | |
| 2007/0111350 A1 | 5/2007 | Weiss et al. | |
| 2007/0122101 A1 | 5/2007 | Buretea et al. | |
| 2007/0170418 A1 | 7/2007 | Bowers et al. | |
| 2007/0186846 A1 | 8/2007 | Yong et al. | |
| 2007/0237460 A1 | 10/2007 | Fan et al. | |
| 2007/0242713 A1 | 10/2007 | Spariosu et al. | |
| 2008/0038558 A1 | 2/2008 | Landry et al. | |
| 2008/0182105 A1 | 7/2008 | Wang et al. | |
| 2008/0206152 A1 | 8/2008 | Hoffmann et al. | |
| 2008/0237540 A1 | 10/2008 | Dubrow | |
| 2008/0237541 A1 | 10/2008 | Zalyubovskiy et al. | |
| 2008/0252209 A1 | 10/2008 | Jang et al. | |
| 2008/0258115 A1 | 10/2008 | Ying et al. | |
| 2008/0290028 A1 | 11/2008 | Kim et al. | |
| 2008/0296534 A1 | 12/2008 | Lifshitz et al. | |
| 2008/0305334 A1 | 12/2008 | Jang et al. | |
| 2009/0032781 A1 | 2/2009 | Wang et al. | |
| 2009/0065742 A1 | 3/2009 | Shih et al. | |
| 2009/0068820 A1 | 3/2009 | Chan et al. | |
| 2009/0169892 A1 | 7/2009 | Bazzi et al. | |
| 2009/0272426 A1 | 11/2009 | Winscom | |
| 2009/0302304 A1 | 12/2009 | Peng et al. | |
| 2009/0315016 A1 | 12/2009 | Elam et al. | |
| 2010/0001256 A1 | 1/2010 | Coe-Sullivan et al. | |
| 2010/0019211 A1 | 1/2010 | Yi et al. | |
| 2010/0032645 A1 | 2/2010 | Choi et al. | |
| 2010/0035365 A1 | 2/2010 | Wiesner et al. | |
| 2010/0044635 A1 | 2/2010 | Breen et al. | |
| 2010/0046072 A1 | 2/2010 | Matsunami | |
| 2010/0051870 A1 | 3/2010 | Ramprasad | |
| 2010/0051988 A1 | 3/2010 | Mitsuishi et al. | |
| 2010/0053930 A1 | 3/2010 | Kim et al. | |
| 2010/0068468 A1 | 3/2010 | Coe-Sullivan et al. | |
| 2010/0086872 A1 | 4/2010 | Ogihara et al. | |
| 2010/0108986 A1 | 5/2010 | Fuertes et al. | |
| 2010/0123155 A1 | 5/2010 | Pickett et al. | |

(56) References Cited

U.S. PATENT DOCUMENTS

| | | |
|---|---|---|
| 2010/0127216 A1 | 5/2010 | Yao et al. |
| 2010/0163798 A1 | 7/2010 | Ryowa et al. |
| 2010/0167011 A1 | 7/2010 | Dubrow |
| 2010/0213437 A1 | 8/2010 | Akai et al. |
| 2010/0224856 A1 | 9/2010 | Iizumi et al. |
| 2010/0237323 A1 | 9/2010 | Akai et al. |
| 2010/0255311 A1 | 10/2010 | Lee et al. |
| 2010/0261263 A1 | 10/2010 | Vo-Dinh et al. |
| 2010/0267170 A1 | 10/2010 | Swanson et al. |
| 2010/0276638 A1 | 11/2010 | Liu et al. |
| 2010/0288344 A1 | 11/2010 | Spitzer |
| 2010/0289001 A1 | 11/2010 | Kahen et al. |
| 2010/0289003 A1 | 11/2010 | Kahen et al. |
| 2010/0308271 A1 | 12/2010 | Bartel |
| 2010/0308272 A1 | 12/2010 | Peng et al. |
| 2010/0326506 A1 | 12/2010 | Lifshitz et al. |
| 2011/0012087 A1 | 1/2011 | Allen et al. |
| 2011/0015380 A1 | 1/2011 | Vezenov |
| 2011/0017292 A1 | 1/2011 | Cho et al. |
| 2011/0022148 A1 | 1/2011 | Ruane et al. |
| 2011/0039983 A1 | 2/2011 | Kuehner |
| 2011/0049442 A1 | 3/2011 | Schreuder et al. |
| 2011/0052918 A1 | 3/2011 | Krauss et al. |
| 2011/0068321 A1 | 3/2011 | Pickett et al. |
| 2011/0068322 A1 | 3/2011 | Pickett et al. |
| 2011/0080090 A1 | 4/2011 | Wood et al. |
| 2011/0089375 A1 | 4/2011 | Chan et al. |
| 2011/0110868 A1 | 5/2011 | Akhtari et al. |
| 2011/0124185 A1 | 5/2011 | Alivisatos et al. |
| 2011/0129537 A1 | 6/2011 | Vo-Dinh et al. |
| 2011/0150938 A1 | 6/2011 | Cao et al. |
| 2011/0175030 A1 | 7/2011 | Ren et al. |
| 2011/0176291 A1 | 7/2011 | Sanders et al. |
| 2011/0189102 A1 | 8/2011 | Kairdolf et al. |
| 2011/0212561 A1 | 9/2011 | Banin et al. |
| 2011/0220194 A1 | 9/2011 | Kurtin et al. |
| 2011/0223425 A1 | 9/2011 | Schreuder et al. |
| 2011/0226991 A1 | 9/2011 | Treadway et al. |
| 2011/0227034 A1 | 9/2011 | Kang et al. |
| 2011/0233468 A1 | 9/2011 | Zong et al. |
| 2011/0274832 A1 | 11/2011 | Dai et al. |
| 2011/0311453 A1 | 12/2011 | Nie et al. |
| 2012/0049119 A1 | 3/2012 | Greytak et al. |
| 2012/0060897 A1 | 3/2012 | Bomm et al. |
| 2012/0064134 A1 | 3/2012 | Bourke, Jr. et al. |
| 2012/0082728 A1 | 4/2012 | Schneider et al. |
| 2012/0103404 A1 | 5/2012 | Fuke et al. |
| 2012/0175588 A1 | 7/2012 | Qiao et al. |
| 2012/0193605 A1 | 8/2012 | Gillies et al. |
| 2012/0211774 A1 | 8/2012 | Harada |
| 2012/0222723 A1 | 9/2012 | Mayer et al. |
| 2012/0270231 A1 | 10/2012 | Smith et al. |
| 2013/0112940 A1 | 5/2013 | Kurtin et al. |
| 2013/0112941 A1 | 5/2013 | Kurtin et al. |
| 2013/0112942 A1 | 5/2013 | Kurtin et al. |
| 2013/0115455 A1 | 5/2013 | Banin et al. |
| 2013/0206219 A1 | 8/2013 | Kurtin et al. |
| 2013/0256633 A1 | 10/2013 | Kurtin et al. |
| 2013/0320298 A1 | 12/2013 | Kurtin et al. |
| 2014/0009902 A1 | 1/2014 | Banin et al. |
| 2014/0022779 A1 | 1/2014 | Su et al. |
| 2014/0049155 A1 | 2/2014 | Kurtin |
| 2014/0117311 A1 | 5/2014 | Kurtin |
| 2014/0160569 A1 | 6/2014 | Blair et al. |
| 2014/0166973 A1 | 6/2014 | Kurtin et al. |
| 2014/0264073 A1 | 9/2014 | McLaughlin et al. |
| 2014/0264196 A1 | 9/2014 | Werner et al. |
| 2014/0264257 A1 | 9/2014 | Hughes et al. |
| 2015/0008393 A1 | 1/2015 | Mangum et al. |
| 2015/0011029 A1 | 1/2015 | Mangum et al. |
| 2015/0240153 A1 | 8/2015 | Hughes et al. |
| 2015/0278919 A1 | 10/2015 | Stoll et al. |
| 2016/0032183 A1 | 2/2016 | Ghosh et al. |
| 2016/0084476 A1 | 3/2016 | Koole et al. |
| 2016/0137916 A1 | 5/2016 | Wachi |
| 2016/0141463 A1 | 5/2016 | Kurtin et al. |
| 2016/0149097 A1 | 5/2016 | Saka et al. |
| 2016/0230088 A1 | 8/2016 | Puetz et al. |
| 2016/0268483 A1 | 9/2016 | Theobald et al. |
| 2016/0333264 A1 | 11/2016 | Zhao et al. |
| 2017/0084768 A1 | 3/2017 | Mayer et al. |
| 2017/0271563 A1 | 9/2017 | Durgan et al. |
| 2018/0166596 A1 | 6/2018 | Boulais et al. |
| 2018/0342652 A1 | 11/2018 | Kurtin et al. |

FOREIGN PATENT DOCUMENTS

| | | |
|---|---|---|
| CN | 101835875 A | 9/2010 |
| CN | 102201506 A | 9/2011 |
| CN | 101810054 B | 4/2013 |
| CN | 101641424 B | 12/2013 |
| CN | 104066813 A | 9/2014 |
| CN | 104302729 A | 1/2015 |
| CN | 102201506 B | 7/2015 |
| EP | 2472612 A1 | 7/2012 |
| EP | 3268981 A4 | 7/2018 |
| EP | 2798037 B1 | 3/2019 |
| EP | 3495447 A1 | 6/2019 |
| EP | 2798036 B1 | 11/2019 |
| JP | 2006083219 A | 3/2006 |
| JP | 2006513458 A | 4/2006 |
| JP | 2008050603 A | 3/2008 |
| JP | 2008516782 A | 5/2008 |
| JP | 2010126596 A | 6/2010 |
| JP | 2011040486 A | 2/2011 |
| JP | 2011155115 A | 8/2011 |
| JP | 5035472 B | 9/2012 |
| JP | 2013539798 A | 10/2013 |
| JP | 2014534322 A | 12/2014 |
| JP | 2015504459 A | 2/2015 |
| KR | 20070119104 A | 12/2007 |
| KR | 20110106176 A | 9/2011 |
| KR | 20110140049 A | 12/2011 |
| KR | 101159853 B1 | 6/2012 |
| KR | 20120095486 A | 8/2012 |
| KR | 1020140102210 A | 8/2014 |
| KR | 1020140102211 A | 8/2014 |
| WO | 2005001889 A2 | 1/2005 |
| WO | 2005022120 A2 | 3/2005 |
| WO | 2009020436 A1 | 2/2009 |
| WO | 2011002509 A1 | 1/2011 |
| WO | 2011092647 A2 | 8/2011 |
| WO | 2012018649 A2 | 2/2012 |
| WO | 2012035535 A1 | 3/2012 |
| WO | 2012059931 A1 | 5/2012 |
| WO | 2013070319 A1 | 5/2013 |
| WO | 2013070320 A1 | 5/2013 |
| WO | 2013070321 A1 | 5/2013 |
| WO | 2015009728 A1 | 1/2015 |
| WO | 2016145109 A1 | 9/2016 |
| WO | 2017004145 A1 | 1/2017 |

OTHER PUBLICATIONS

Töpfer, O. et al, "Surface—Functionalized Inorganic Nanoparticles in Miniemulsion Polymerization," Macromolecular Symposia, vol. 248, No. 1, (Feb. 1, 2007), pp. 239-248.

Alivastos, et al., "Quantum Dots as Cellular Probes," Annu. Rev Biomed. Eng. 2005. 7:55-76.

Arkles, B., et al., "Dipodal Silanes," 2008, 3 pages, adhesivesmag. com/articles/dipodal-silanes.

Azonano, "Quantum Dots—A Definition, How they work, Manufacturing, Applications and Their Use in Fighting Cancer," 2006, Accessed via http:/www.azonano.com/article.asap?ArticleID=1814.

Baranov, et al., "Effect of ZnS shell thickness on the phonon spectra in CdSe quantum dots," Physical Review, B 68, 2003, pp. 165306-1-165306-7.

Brinker, et al., "Sol Gel Glass: I. Gelation and Gell Structure," Journal of Non-Crystalline Solids 70, 1985, pp. 301-322.

(56) References Cited

OTHER PUBLICATIONS

Bruchez M., et al., "Semiconductor Nanocrystals as Fluorescent Biological Labels," Science, vol. 281, No. 5385, American Association for the Advancement of Science, US, Sep. 25, 1998, pp. 2013-2016.
Burda, C., et al., "Chemistry and properties of nanocrystals of different shapes," Chem. Rev. vol. 105, No. 4, 2005, pp. 1025-1102.
Carbone, L., et al., "Synthesis and Micrometer-Scale Assembly of Colloidal CdSe/CdS Nanorods Prepared by a Seeded Growth Approach," Nano Lett., vol. 7, No. 10, 2007, pp. 2942-2950.
Chan, Y., et al., "Incorporation of Luminescent Nanocrystals into Monodisperse Core-Shell Silica Microspheres," Advanced Materials, vol. 16, No. 23-24, 2004, pp. 2092-2097.
Chen, Y., et.al., "'Giant' Multishell CdSe Nanocrystal Quantum Dots with Suppressed Blinking," Journal of the American Chemical Society, vol. 130, No. 15, 2008, pp. 6026-6027.
Cho, M., et al., "Facile synthesis and optical properties of colloidal silica microspheres encapsulating a quantum dot layer," The Royal Society of Chemistry, No. 46, 2010, pp. 5584-5586.
Dabboussi, B.O., et al., "(CdSe)Zns Core-Shell Quantum Dots; Synthesis and Characteristion of a Size Series of Highly Luminescent Nanocrystallites," Journal of Physical Chemistry, vol. 101, No. 46, 1997, pp. 9463-9475.
Darbandi, M., "Silica coated nanocomposites," Faculty of Applied Sciences, 2007, entire document.
Decision of Rejection for Japanese Patent Application No. 2014-541053 dated Dec. 13, 2016, 5 pages.
Decision of Rejection from Chinese Patent Application No. 201280065133.6, dated Jul. 29, 2016, 20 pages.
Deka, S., et al., "CdSe/CdS/ZnS Double Shell Nanorods with High Photoluminescence Efficiency and Their Exploitation as Biolabeling Probes," Journal of the American Chemical Society, vol. 131, No. 8, 2009, pp. 2948-2958.
English translation of Notice of Reasons for Rejection for Japanese Application No. 2014-541053, dated Aug. 9, 2016, 3 pages.
Extended European Search Report for European Patent Application No. 12847949.0, dated Aug. 25, 2015, 8 pages.
Extended European Search Report for European Patent Application No. 12847998.7, dated Aug. 25, 2015, 6 pages.
Extended European Search Report for European Patent Application No. 12848041.5, dated Aug. 25, 2015, 7 pages.
Fan, et al., "Coupling semiconductor nanocrystals to a fused-silica microsphere: a quantum-dot microcavity with extremely high Q factors," Optics Letters, vol. 25, No. 21, Nov. 1, 2000, pp. 1600-1602.
Final Office Action for U.S. Appl. No. 13/485,756, dated Feb. 4, 2014, 29 pages.
Final Office Action for U.S. Appl. No. 13/485,756, dated Nov. 10, 2014, 25 pages.
Final Office Action for U.S. Appl. No. 13/485,761, dated Jul. 17, 2015, 37 pages.
Final Office Action for U.S. Appl. No. 13/485,761, dated Dec. 12, 2013, 20 pages.
Final Office Action for U.S. Appl. No. 13/485,761; dated Aug. 12, 2014, 19 pages.
Final Office Action for U.S. Appl. No. 13/485,762 dated Dec. 12, 2014, 33 pages.
Final Office Action for U.S. Appl. No. 13/485,762, dated Mar. 12, 2014, 30 pages.
Final Office Action for U.S. Appl. No. 13/903,875, dated May 23, 2014, 13 pages.
Final Office Action for U.S. Appl. No. 13/903,890, dated Feb. 6, 2015, 9 pages.
Final Office Action for U.S. Appl. No. 13/903,890, dated Apr. 5, 2016, 22 pages.
Final Office Action for U.S. Appl. No. 13/903,890, dated May 7, 2014, 12 pages.
Zhong, X., et al., "Composition-Tunable ZnxCdi-xSe Nanocrystals with High Luminescence and Stability," J. Am. Chem. Soc., 125 (28), Mar. 11, 2003, pp. 8589-8594.
Zhu, M.-Q., et al., "CdSe/CdS/SiO2 Core/Shell/Shell Nanoparticles," Journal of Nanoscience and Nanotechnology, vol. 7, 2007, pp. 2343-2348.
Ziegler, J., et al., "Silica-Coated InP/ZnS Nanocrystals as Converter Material in White LEDs," Advanced Materials, vol. 20, No. 21, Nov. 3, 2008, pp. 4068-4073.
Zou, H., et al., "Polymer/Silica Nanocomposites: Preparation, Characterization, Properties, and Applications," Chem. Rev. vol. 108, No. 9, 2008, pp. 3893-3957.
Final Office Action for U.S. Appl. No. 13/972,700, dated Feb. 26, 2016, 19 pages.
Final Office Action for U.S. Appl. No. 14/685,570, dated Apr. 18, 2016, 25 pages.
First Office Action for Chinese Patent Application No. 201280064403.1, dated Jun. 30, 2015, 31 pages.
First Office Action for Chinese Patent Application No. 201280065133.6, dated Apr. 21, 2015, 23 pages.
First Office Action from Chinese Patent Application No. 201280065164.1 dated Mar. 23, 2015, 12 pages.
Fortunati, et al., "CdSe Core-Shell Nanoparticles as Active Materials for Up-Converted Emission," The Journal of Physical Chemistry, vol. 115, 2011, pp. 3840-3846.
Fourth Office Action from Chinese Patent Application No. 201280065164.1, dated Sep. 9, 2016, 17 pages.
Gerion, D. et al., "Synthesis and properties of biocompatible water-soluble silica-coated CdSe/ZnS semiconductor quantum dots," The Journal of Physical Chemistry B., vol. 105, 2001, pp. 8861-8871, XP002262702.
Graf, C., et al., "A General Method to Coat Colloidal Particles with Silica," Langmuir, vol. 19, No. 17, May 8, 2003, pp. 6693-6700, American Chemical Society, US.
Green, M., "The Nature of Quantum Dot Capping Ligands," J. Mater. Chem., vol. 20, Apr. 1, 2010, pp. 5797-5809, The Royal Society of Chemistry, UK.
Hines, M.A., et al., "Synthesis and Characterization of Strongly Luminescing ZnS-Capped CdSe NanoCrystals," J. Phys. Chem., vol. 100, Oct. 16, 1995, pp. 468-471, American Chemical Society, US.
Hu, X. et al., "Silica-polymer dual layer-encapsulated quantum dots with remarkable stability," ACS Nano., vol. 4, No. 10, 2010, pp. 6080-6086, XP055331519.
International Preliminary Report on Patentability for International Patent Application No. PCT/US2012/055623, dated May 13, 2014, 11 pages.
International Preliminary Report on Patentability for International Patent Application No. PCT/US2012/055625, dated May 13, 2014, 7 pages.
International Preliminary Report on Patentability for International Patent Application No. PCT/US2012/055626, dated May 13, 2014, 7 pages.
International Preliminary Report on Patentability for International Patent Application No. PCT/US2014/044663, dated Jan. 5, 2016, 8 pages.
International Search Report and Written Opinion for International Patent Application No. PCT/US2012/055623, dated Feb. 25, 2013, 14 pages.
International Search Report and Written Opinion for International Patent Application No. PCT/US2012/055625, dated Mar. 26, 2013, 11 pages.
International Search Report and Written Opinion for International Patent Application No. PCT/US2012/055626, dated Feb. 28, 2013, 10 pages.
International Search Report and Written Opinion for International Patent Application No. PCT/US2014/044663, dated Oct. 16, 2014, 11 pages.
International Search Report and Written Opinion for International Patent Application No. PCT/US2016/032557, dated Aug. 22, 2016, 11 pages.
Kim, J.S., et al., "Thermally stable transparent sol-gel based siloxane hybrid material with high refractive index for light emitting diode (LED) encapsulation," Chem. Mater, vol. 22 (11), 2010, pp. 3549-3555.

(56) References Cited

OTHER PUBLICATIONS

Koole, R., et al., "On the Incorporation Mechanism of Hydrophobic Quantum Dots in Silica Spheres by a Reverse Microemulsion Method," Chemical Mater, vol. 20, No. 7, 2008, pp. 2503-2512.
Kumar, R., et al., "In vitro and in vivo Optical Imaging Using Water-Dispersible, Noncytotoxic, Luminescent, Silica-Coated Quantum Rods," Chem. Mater., vol. 22, No. 7, 2010, pp. 2261-2267.
Lewis, L.N., et al., "Platinum catalysts used in the silicones industry, their synthesis and activity in hydrosilylation," Platinum Metals Rev., vol. 41, 1997, pp. 66-75.
Littau, K.A., et al., "A Luminescent Silicon Nanocrystal Colloid via a High-Temperature Aerosol Reaction," The Journal of Physical Chemistry, vol. 97, No. 6, 1993, pp. 1224-1230.
Liu, H. et al., "Mechanistic Study of Precursor Evolution in Colloidal Group II-VI Semiconductor Nanocrystal Synthesis," J. Am. Chem. Soc., vol. 129, No. 2, Jan. 17, 2007, pp. 305-312, American Chemical Society, US.
Lu, C. et al., "High Refractive Index Thins of ZnS/Polythiourethane Nanocomposites," J. Mater. Chem., vol. 13, Feb. 4, 2003, pp. 526-530, The Royal Society of Chemistry, UK.
Manna, L., et al., "Epitaxial Growth and Photochemical Annealing of Graded CdS/ZnS Shells on Colloidal CdSe Nanorods," Journal of the American Chemical Society, vol. 124, No. 24, 2002, pp. 7136-7145.
Mcbride, J., et al., "Structural Basis for Near Unity Quantum Yield Core/Shell Nanostructures," Nano Letters, vol. 6, No. 7, May 9, 2006, pp. 1496-1501.
Mensinger, Z.L., et al., "Synthesis of Heterometallic Group 13 Nanoclusters and Inks for Oxide Thin-Film Transistors," Angew. Chem. Int. Ed., vol. 47, 2008, pp. 9484-9486.
Mokari, T., et al., "Synthesis and Properties of CdSe/ZnS Core/Shell Nanorods," Chemical Mater, vol. 15, No. 20, 2003, pp. 3955-3960.
Nann, T., et al., "Single Quantum Dots in Spherical Silica Particles," Angewandte Chemie, vol. 43, 2004, pp. 5393-5396.
Non-Final Office Action for U.S. Appl. No. 13/485,756, dated Jul. 16, 2014, 20 pages.
Non-Final Office Action for U.S. Appl. No. 13/485,756, dated Aug. 29, 2013, 23 pages.
Non-Final Office Action for U.S. Appl. No. 13/485,761, dated Jan. 14, 2015, 25 pages.
Non-Final Office Action for U.S. Appl. No. 13/485,761, dated Mar. 26, 2014, 15 pages.
Non-Final Office Action for U.S. Appl. No. 13/485,761, dated Jul. 25, 2013, 18 pages.
Non-Final Office Action for U.S. Appl. No. 13/485,762, dated Jul. 30, 2014, 28 pages.
Non-Final Office Action for U.S. Appl. No. 13/485,762, dated Dec. 3, 2013, 39 pages.
Non-Final Office Action for U.S. Appl. No. 13/663,300, dated Jan. 29, 2014, 31 pages.
Non-Final Office Action for U.S. Appl. No. 13/903,875, dated Feb. 11, 2014, 12 pages.
Non-Final Office Action for U.S. Appl. No. 13/903,875, dated Sep. 5, 2013, 12 pages.
Non-Final Office Action for U.S. Appl. No. 13/903,875, dated Nov. 24, 2014, 22 pages.
Non-Final Office Action for U.S. Appl. No. 13/903,883, dated Sep. 24, 2013, 18 pages.
Non-Final Office Action for U.S. Appl. No. 13/903,883, dated Nov. 6, 2014, 21 pages.
Non-Final Office Action for U.S. Appl. No. 13/903,890, dated Jun. 5, 2015, 23 pages.
Non-Final Office Action for U.S. Appl. No. 13/903,890, dated Aug. 13, 2014, 15 pages.
Non-Final Office Action for U.S. Appl. No. 13/903,890, dated Sep. 11, 2013, 7 pages.
Non-Final Office Action for U.S. Appl. No. 13/972,700, dated Aug. 28, 2015, 18 pages.
Non-Final Office Action for U.S. Appl. No. 14/104,489, dated Feb. 20, 2015, 12 pages.
Non-Final Office Action for U.S. Appl. No. 14/685,570, dated Jan. 23, 2017, 25 pages.
Non-Final Office Action for U.S. Appl. No. 14/685,570, dated Sep. 14, 2015, 26 pages.
Non-Final Office Action for U.S. Appl. No. 15/004,478, dated May 23, 2017, 24 pages.
Notice of Allowance for U.S. Appl. No. 13/485,756, dated Aug. 7, 2015.
Notice of Allowance for U.S. Appl. No. 13/903,875, dated Aug. 7, 2015.
Notice of Allowance for U.S. Appl. No. 14/104,489, dated Sep. 21, 2015.
Notice of Reasons for Rejection for Japanese Patent Application No. 2014-541054, dated Jan. 10, 2017, 9 pages.
Notice of Reasons for Rejection for Japanese Patent Application No. 2014-541055, dated Jun. 7, 2016, 8 pages.
Notification of Reexamination for Chinese Patent Application No. 201280065133.6, dated May 19, 2017, 20 pages.
Owen, J., et al., "Precursor Conversion Kinetics and the Nucleation of Cadmium Selenide Nanocrystals," J. Am. Chem. Soc., vol. 132, No. 51, Dec. 3, 2010, pp. 18206-18213, American Chemical Society, US.
Pal, B.N., et al., "Giant CdSe/CdS Core/Shell Nanocrystal Quantum Dots as Efficient Electroluminescent Materials; Strong Influence of Shell Thickness on Light-Emitting Diode Performance," Nano Lett., 12(1), 2012, pp. 331-336.
Park, J., et al, "Synthesis of Monodisperse Spherical Nanocrystals," Angew. Chem. Int. Ed., vol. 46, No. 25, Jun. 11, 2007, pp. 4630-4660, Wiley-VCH Verlag GmbH & Co., DE.
Pastoriza-Santos, I., et al., "One-pot synthesis of Ag@ TiO2 core-shell nanoparticles and their layer-by-layer assembly," Langmuir (2000), vol. 16, No. 6, pp. 2731-2735, XP055256666.
Peng, X., et al., "Epitaxial Growth of Highly Luminescent CdSe/ CdS Core/Shell Nanocrystals with Photostability and Electronic Accessibilty," Journal of the American Chemical Society, vol. 119, No. 30, 1997, pp. 7019-7029.
Peng, X., et al., "Shape control of CdSe nanocrystals," Letters to Nature, vol. 404, 2000, pp. 59-61.
Peng, Z. A., et al., "Mechanisms of the Shape Evolution of CdSe Nanocrystals," Journal of the American Chemical Society, vol. 123, No. 7, 2001, pp. 1389-1395.
Peng, Z. A., et al., "Formation of High-Quality CdTe, CdSe, and CdS Nanocrystals Using CdO as Precursor," Journal of American Chemical Society, vol. 123, No. 1, 2001, pp. 183-184.
Peng, Z. A., et al., "Nearly Monodisperse and Shape-Controlled CdSe Nanocrystals via Alternative Routes: Nucleation and Growth," Journal of the American Chemical Society, vol. 124, No. 13, 2002, pp. 3343-3353.
Porres, L, et al., "Absolute Measurements of Photoluminescence Quantum Yields of Solutions Using an Integrating Sphere," Journal of Fluorescence, vol. 16, No. 2, Mar. 2006, pp. 267-272, Springer, US.
Qian, L. et al., "Stable and efficient quantum-dot light-emitting diodes based on solution-processed multilayer structures," Nature Photonics, (20110000), vol. 5, No. 9, pp. 543-548, XP055331520.
Qian, L., et al., "High efficiency photoluminescence from silica-coated CdSe quantum dots"; Appl. Phys. Lett., vol. 94, Issue 7, Feb. 2009, p. 073112.
Qu, L., et al., "Alternative Routes toward High Quality CdSe Nanocrystals," Nano Letters, vol. 1, No. 6, 2001, pp. 333-337.
Reed, M.A. et. al., "Observation of discrete electronic states in a zero-dimensional semiconductor nanostructure," Phys Rev Lett., 1988, vol. 60, No. 6, pp. 535-539.
Reiss, P., et al., "Highly Luminescent CdSe and CdSe/ZnSe Core/ Shell Nanocrystals of Low Size Dispersion," Nano Letters, vol. 2, No. 7, Jun. 6, 2002, pp. 781-784, American Chemical Society, US.
Reiss, P., et al., "Core/Shell Semiconductor Nanocrystals," Small, vol. 5, No. 2, 2009, pp. 154-168.
Restriction Requirement for U.S. Appl. No. 13/485,756, dated Apr. 29, 2013, 7 pages.
Restriction Requirement for U.S. Appl. No. 13/485,762, dated Sep. 27, 2013, 7 pages.

(56) References Cited

OTHER PUBLICATIONS

Restriction Requirement for U.S. Appl. No. 13/972,700, dated Jun. 17, 2015, 5 pages.
Restriction Requirement for U.S. Appl. No. 13/485,761, dated Apr. 25, 2013, 5 pages.
Rosa-Fox, et al., "Organic-Inorganic Hybrid Materials from Sonogels," Apr. 26, 2002, 92 pgs.
Schlamp, M.C., et al., "Improved efficiencies in light emitting diodes made with CdSe(CdS) core/shell type nanocrystals and a semiconducting polymer," Journal of Applied Physics, vol. 82, 1997, pp. 5837-5842.
Second Office Action for Chinese Patent Application No. 201280064403.1, dated Apr. 26, 2016, 12 pages.
Second Office Action for Chinese Patent Application No. 201280065133.6, dated Jan. 13, 2016, 18 pages.
Second Office Action for Chinese Patent Application No. 201280065164.1, dated Nov. 11, 2015, 6 pages.
Selvan, S. T., et al., "Robust, Non-Cytotoxic, Silica-Coated CdSe Quantum Dots with Efficient Photoluminescence," Adv. Mater, vol. 17, No. 13, May 4, 2005, pp. 1620-1625, Wiley-VCH Verlag GmbH & Co., DE.
Sun, Y., et al., "Fabrication and optical properties of thin silica-coated CdSe/ZnS quantum dots," Phys. Status Solidi A, vol. 206, No. 12, 2009, pp. 2822-2825.
Talapin, D.V., et al., "CdSe/CdS/ZnS and CdSe/ZnSe/ZnS core-shell-shell nanocrystals," J. Phys. Chem. B, 2004, 108, pp. 18826-18831.
Talapin, D.V., et al., "Highly Emissive Colloidal CdSe/CdS Heterostructures of Mixed Dimensionality," Nano Letters, vol. 3, No. 12, 2003, pp. 1677-1681.
Talapin, D.V., et al., "Seeded Growth of Highly Luminescent CdSe/CdS Nano-Heterostructures with Rod and Tetrapod Morphologies," Nano Letters, vol. 7, No. 10, Sep. 11, 2007, pp. 2951-2959, American Chemical Society, US.
Third Office Action for Chinese Patent Application No. 201280064403.1, dated Jan. 13, 2017, 35 pages.
Third Office Action for Chinese Patent Application No. 201280065164.1, dated Mar. 16, 2016, 7 pages.
Tomczak, N., et al., "Designer polymer-quantum dot architectures," Progress in Polymer Science, vol. 34, Feb. 10, 2009, pp. 393-430.
Wang, X., et al., "Non-blinking semiconductor nanocrystals," Macmillan Publishers Limited, 2009, pp. 1-4.
Ye, et al., "Progress of application of inorganic nano-particles modified with coupling agents in waterborne coatings," Paint & Coatings Industry, vol. 39, No. 7, Jul. 2009, pp. 64-67.
Yi, D.K., et al., "Silica-Coated Nanocomposites of Magnetic Nanoparticles and Quantum Dots," J. Am Chem Soc. 2005, 127, pp. 4990-4991.
Zhang, J., et al, "Nonepitaxial Growth of Hybrid Core-Shell Nanostructures with Large Lattice Mismatches," Science, vol. 327, Mar. 26, 2010, 6 pgs.
Zhao, J., et al, "Efficient CdSe/CdS Quantum Dot Light-Emitting Diodes Using a Thermally Polymerized Hole Transport Layer," Nano Letters, 2006, vol. 6, No. 3, pp. 463-467.
Alvisatos, et al., "Quantum Dots as Cellular Probes," Annu. Rev. Biomed, Eng. 2008, 7:55-76.
Final Office Action for U.S. Appl. No. 13/903,883, dated Jul. 3, 2014, 21 pages.
Notice of Reasons for Rejection for Japanese Patent Application No. 2014-541053, dated Aug. 9, 2016, 3 pages.
Owen, J., et al., "Reaction Chemistry and Ligand Exchange at Cadmium Selenide Nanocrystal Surfaces," J. Am. Chem. Soc., vol. 130, No. 37, Aug. 23, 2008, pp. 12279-12281; American Chemical Society, US.
Talapin, D.V., et al., "Highly Luminescent Monodisperse CdSe and CdSe/ZnS Nanocrystals Synthesized in a Hexadecylamine—Trioctylphosphine Oxide—Trioctylphospine Mixture," Nano Letters, vol. 1, No. 4, Jan. 30, 2001, pp. 207-211, American Chemical Society, US.

Notice of Allowance for Korean Patent Application No. 10-2014-7015628, dated Jun. 25, 2019, 4 pages.
Chin, P.T.K, et al., "Highly Luminescent CdTe/CdSe Colloidal Heteronanocrystals with Temperature-Dependent Emission Color," Journal of the American Chemical Society, vol. 129, No. 48 (Dec. 1, 2007), pp. 14880-14886.
Extended European Search Report for European Patent Application No. 19199909.3, dated Nov. 7, 2019, 7 pages.
Extended European Search Report for European Patent Application No. 19200464.6, dated Nov. 7, 2019, 7 pages.
Notice of 2nd Final Rejection After Re-examination for Korea Patent Application No. 10-2014-7015626, dated Aug. 28, 2019, 3 pages.
Examination Report for European Patent Application No. 19153485.8, dated Jan. 3, 2020, 7 pages.
Final Office Action for U.S. Appl. No. 13/903,890, dated May 7, 2014, 11 pages.
Final Office Action for U.S. Appl. No. 13/903,890, dated Feb. 6, 2015, 10 pages.
Final Office Action for U.S. Appl. No. 13/903,890, dated Apr. 5, 2016, 20 pages.
Non-Final Office Action for U.S. Appl. No. 13/713,669, dated Mar. 18, 2014, 15 pages.
Notice of 1st Final Rejection for Korea Patent Application No. 10-2014-7015626, dated Jun. 25, 2019, 4 pages.
Decision of Rejection for Japanese Patent Application No. 2014-541054, dated Oct. 24, 2017, 2 pages.
Extended European Search Report for European Patent Application No. 16762453.5, dated Jun. 6, 2018, 8 pages.
Final Office Action for U.S. Appl. No. 14/704,867, dated Mar. 9, 2016, 36 pages.
International Preliminary Report on Patentability for International Patent Application No. PCT/US16/21605, dated Sep. 12, 2017, 5 pages.
International Preliminary Report on Patentability for International Patent Application No. US/PCT16/32557, dated Nov. 14, 2017, 6 pages.
International Search Report and Written Opinion for International Patent Application No. PCT/US2016/021605, dated May 30, 2016, 8 pages.
Non-Final Office Action for U.S. Appl. No. 14/704,867, dated Jul. 7, 2015, 50 pages.
Non-Final Office Action for U.S. Appl. No. 14/905,759, dated Jun. 12, 2020, 13 pages.
Non-Final Office Action for U.S. Appl. No. 15/064,491, dated Nov. 2, 2016, 7 pages.
Notice of Allowance for U.S. Appl. No. 14/685,570, dated Aug. 7, 2017, 8 pages.
Notice of Allowance for U.S. Appl. No. 15/004,478, dated Jul. 23, 2018, 8 pages.
Notice of Allowance for U.S. Appl. No. 15/064,491, dated Aug. 16, 2017, 8 pages.
Notice of Allowance for U.S. Appl. No. 15/369,752, dated Apr. 10, 2019, 14 pages.
Notification of Reason for Refusal for Korea Patent Application No. 10-2014-7015628, dated Dec. 13, 2018, 11 pages.
Final Office Action for U.S. Appl. No. 14/905,759, dated Nov. 13, 2020, 13 pages.
Alivisatos, A. P., "Perspectives on the Physical Chemistry of Semiconductor Nanocrystals," J. Phys. Chem., vol. 100, No. 31, (1996), p. 13226-13239.
Al-Salim, N., et al., "Synthesis of CdSeS Nanocrystals in Coordinating and Noncoordinating Solvents: Solvent's Role in Evolution of the Optical and Structural Properties," Chemistry of Materials, vol. 19, No. 21, (Mar. 26, 2007), pp. 5185-5193.
Aubert, T., et al., "Homogeneously Alloyed CdSe1-xSx Quantum Dots (O × 1): An Efficient Synthesis for Full Optical Tunability," Chemistry of Materials, vol. 25, No. 12, (May 15, 2013), pp. 2388-2390.
Aubert, T., et al., "Supporting Information for Homogeneously Alloyed CdSel-xSx ODs (0 × 1): an Efficient Synthesis for Full Optical Tunability," Chemistry of Materials, (2013), 10 pages.

(56) References Cited

OTHER PUBLICATIONS

Bailey, R. E., et al., "Alloyed Semiconductor Quantum Dots: Tuning the Optical Properties without Changing the Particle Size," Journal of the American Chemical Society, vol. 125 No. 23, (Mar. 5, 2003), pp. 7100-7106.

Bawendi, M. G., et al., "The Quantum Mechanics of Larger Semiconductor Clusters ('Quantum Dots')," Annual Review of Physical Chemistry, vol. 41, (1990), pp. 477-496.

De Mello Donega, C., et al., "Single-Step Synthesis to Control the Photoluminescence Quantum Yield and Size Dispersion of CdSe Nanocrystals," Journal of Physical Chemistry B 2003, 107, (2003), pp. 489-496.

Dubertret, B., et al., "In Vivo Imaging of Quantum Dots Encapsulated in Phospholipid Micelles," Science, vol. 298, [2002], pp. 1759-1762.

Extended European Search Report for European Patent Application No. 21172454.7, dated Jul. 30, 2021, 9 pages.

Final Office Action for U.S. Appl. No. 13/287,407, dated Apr. 1, 2014, 15 pages.

Final Office Action for U.S. Appl. No. 13/287,407, dated Jun. 5, 2013, 15 pages.

Final Office Action for U.S. Appl. No. 13/287,407, dated Aug. 25, 2015, 22 pages.

Final Office Action for U.S. Appl. No. 14/905,759, dated Dec. 30, 2019, 13 pages.

Hakim, L.F., et al., "Nanocoating Individual Silica Nanoparticles by Atomic Layer Deposition in a Fluidized Bed Reactor," Chemical Vapor Deposition, vol. 11, No. 10, (Oct. 2005), pp. 420-425.

International Preliminary Report on Patentability for International Patent Application No. PCT/US14/46708 dated Jan. 28, 2016, 8 pages.

International Search Report and Written Opinion for International Application No. PCT/US2014/046708, dated Nov. 6, 2014, 11 pages.

Jang, E., et al., "High quality CdSeS nanocrystals synthesized by facile single injection process and their electroluminescence," Chemistry Communications, (Sept. 8, 2003), pp. 2964-2965.

Manna, L., et al., "Controlled growth of tetrapod-branched inorganic nanocrystals," Nature Materials, vol. 2, (May 25, 2003), pp. 382-385.

Miszta, K., et al., "Cation Exchange Reactions in Colloidal Branched Nanocrystals," ACS Nano, vol. 5, No. 9, (Aug. 2, 2011), pp. 7176-7183.

Non-Final Office Action for U.S. Appl. No. 13/287,407, dated Jan. 16, 2013, 15 pages.

Non-Final Office Action for U.S. Appl. No. 13/287,407, dated Jan. 21, 2015, 21 pages.

Non-Final Office Action for U.S. Appl. No. 13/287,407, dated Sep. 29, 2014, 21 pages.

Non-Final Office Action for U.S. Appl. No. 13/287,407, dated Nov. 14, 2013, 20 pages.

Non-Final Office Action for U.S. Appl. No. 14/905,759, dated Mar. 19, 2021, 27 pages.

Notice of Allowance for U.S. Appl. No. 13/287,407, dated Aug. 11, 2016, 7 pages.

Ouyang, J., et al., "Noninjection, One-Pot Synthesis of Photoluminescent Colloidal Homogeneously Alloyed CdSeS Quantum Dots," The Journal of Physical Chemistry C, 113 (13), Dec. 13, 2008, pp. 5193-5200.

Sarma, D. D. et al., "Origin of the Enhanced Photoluminescence from Semiconductor CdSeS Nanocrystals," The Journal of Physical Chemistry Letters, 1 (14), Jun. 30, 2010, pp. 2149-2153 and S1-S8.

Scher, E. C., et al., "Shape Control and Applications of Nanocrystals," Phil. Trans. R. Soc. Lond. A, 361, Dec. 17, 2002, pp. 241-257.

Swafford, L.A., et al., "Homogeneously Alloyed $CdS_xSe_{1-x}$ Nanocrystals: Synthesis, Characterization, and Composition/Size-Dependent Band Gap," Journal of the American Chemical Society, 128 (37), Aug. 29, 2006, p. 12299-12306.

Talapin, D. V., et al., "Dynamic Distribution of Growth Rates within the Ensembles of Colloidal II-VI and III-V Semiconductor Nanocrystals as a Factor Governing Their Photoluminescence Efficiency," J. Am. Chem. Soc., 124 [20], Apr. 30, 2002, pp. 5782-5790.

Xie, R., et al., "Colloidal InP Nanocrystals as Efficient Emitters Covering Blue to Near-Infrared," J. Am. Chem. Soc., 129 (50), Nov. 23, 2007, p. 15432-15433.

Yu, W. W., et al., "Experimental Determination of the Extinction Coefficient of CdTe, CdSe, and CdS Nanocrystals," Chem. Mater., 15, 2003, pp. 2854-2860.

Zhelev, Z., et al., "Single Quantum Dot-Micelles Coated with Silica Shell as Potentially Non-Cytotoxic Fluorescent Dell Tracers," J. Am. Chem. Soc., vol. 128 (19), Apr. 21, 2006, pp. 6324-6325.

Zhong, X et al., "Alloyed $Zn_xCd_{1-x}S$ Nanoncrystals with Highly Narrow Luminescence Spectral Width," Journal of the American Chemical Society, 125 (44), Jun. 14, 2003, p. 13559-13563 and s 1.

\* cited by examiner

METHOD FOR FORMING A COMPOSITE HAVING SEMICONDUCTOR STRUCTURES INCLUDING A NANOCRYSTALLINE CORE AND SHELL EMBEDDED IN A MATRIX

CROSS-REFERENCE TO RELATED APPLICATIONS

This application is a divisional of U.S. patent application Ser. No. 14/004,478, filed on Jan. 22, 2016, which is a divisional of U.S. patent application Ser. No. 14/685,570, filed on Apr. 13, 2015, which is a continuation of U.S. patent application Ser. No. 13/485,762, filed on May 31, 2012, which claims the benefit of U.S. Provisional Application No. 61/557,653, filed Nov. 9, 2011, U.S. Provisional Application No. 61/558,964, filed Nov. 11, 2011, and U.S. Provisional Application No. 61/558,974, filed Nov. 11, 2011, the entire contents of which are hereby incorporated by reference herein.

TECHNICAL FIELD

Embodiments of the present invention are in the field of quantum dots for light emitting diodes (LEDs) and, in particular, composites having semiconductor structures embedded in a matrix.

BACKGROUND

Quantum dots having a high photoluminescence quantum yield (PLQY) may be applicable as down-converting materials in down-converting nanocomposites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include composites having semiconductor structures embedded in a matrix.

In an embodiment, a composite includes a matrix material. A plurality of semiconductor structures is embedded in the matrix material. Each semiconductor structure includes an anisotropic nanocrystalline core composed of a first semiconductor material and having an aspect ratio between, but not including, 1.0 and 2.0. Each semiconductor structure also includes a nanocrystalline shell composed of a second, different, semiconductor material at least partially surrounding the anisotropic nanocrystalline core. An insulator layer encapsulates each nanocrystalline shell and anisotropic nanocrystalline core pairing.

In another embodiment, a composite includes a matrix material. A plurality of semiconductor structures is cross-linked with, polarity bound by, or tethered to the matrix material. Each semiconductor structure includes a nanocrystalline core composed of a first semiconductor material and a nanocrystalline shell composed of a second, different, semiconductor material at least partially surrounding the nanocrystalline core. An insulator layer encapsulates each nanocrystalline shell and nanocrystalline core pairing.

In another embodiment, a lighting apparatus includes a light emitting diode. The lighting apparatus also includes a composite coating the light emitting diode. The composite includes a matrix material and a plurality of semiconductor structures embedded in the matrix material. Each semiconductor structure includes a quantum dot composed of a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. An insulator layer encapsulating each quantum dot.

In another embodiment, a method of fabricating a composite includes forming a plurality of semiconductor structures. The forming of each semiconductor structure includes forming an anisotropic nanocrystalline core composed of a first semiconductor material and having an aspect ratio between, but not including, 1.0 and 2.0. A nanocrystalline shell is formed from a second, different, semiconductor material to at least partially surround the anisotropic nanocrystalline core. An insulator layer is formed to encapsulate the nanocrystalline shell and anisotropic nanocrystalline core. The formed plurality of semiconductor structures is then embedded in a matrix material.

In another embodiment, a method of fabricating a composite includes embedding a plurality of semiconductor structures in a matrix material. Each semiconductor structure includes a nanocrystalline core composed of a first semiconductor material and a nanocrystalline shell composed of a second, different, semiconductor material at least partially surrounding the nanocrystalline core. An insulator layer encapsulates each nanocrystalline shell and core pairing. The embedding includes cross-linking, reactive tethering, or ionic bonding the plurality of semiconductor structures with the matrix material.

DETAILED DESCRIPTION

Composites having semiconductor structures embedded in a matrix are described herein. In the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

Disclosed herein are quantum dots having high photoluminescence quantum yields (PLQY's) and methods of making and encapsulating such quantum dots. A high PLQY is achieved by using a synthetic process that significantly reduces the defects and self absorption found in prior art quantum dots. The resulting geometries of the quantum dots may include non-spherical quantum dot cores shelled with a rod-shaped shell. The aspect or volume ratio of the core/shell pairing may be controlled by monitoring the reaction process used to fabricate the pairing. Uses of quantum dot compositions having high PLQYs are also disclosed, including solid state lighting. Other applications include biological imaging and fabrication of photovoltaic devices.

As a reference point, quantum dots based on a spherical cadmium selenide (CdSe) core embedded in a cadmium sulfide (CdS) nanorod shell have been reported. Such quantum dots do not have a high PLQY. Typically, prior art core/shell quantum dots suffer from several structural deficiencies which may contribute to a reduced PLQY. For example, prior art core/shell quantum dots used for downshifting applications typically have overlapping absorption and emission profiles. Profile overlap may be attributed to core material selection such that both the absorption and emission of the quantum dot is controlled by the size, shape, and composition of the core quantum dot, and the shell, if any, is used only as a passivating layer for the surface. However, the prior art arrangement leads to a significant amount of self-absorption (re-absorption of the down-shifted light), which decreases the measured PLQY. Accordingly, a typical prior art core/shell quantum dot PLQY is below 80% which is often not high enough for device applications. Also, prior art core/shell quantum dots suffer from self absorption due in part to inappropriate volume of core/shell material.

Figure 1:
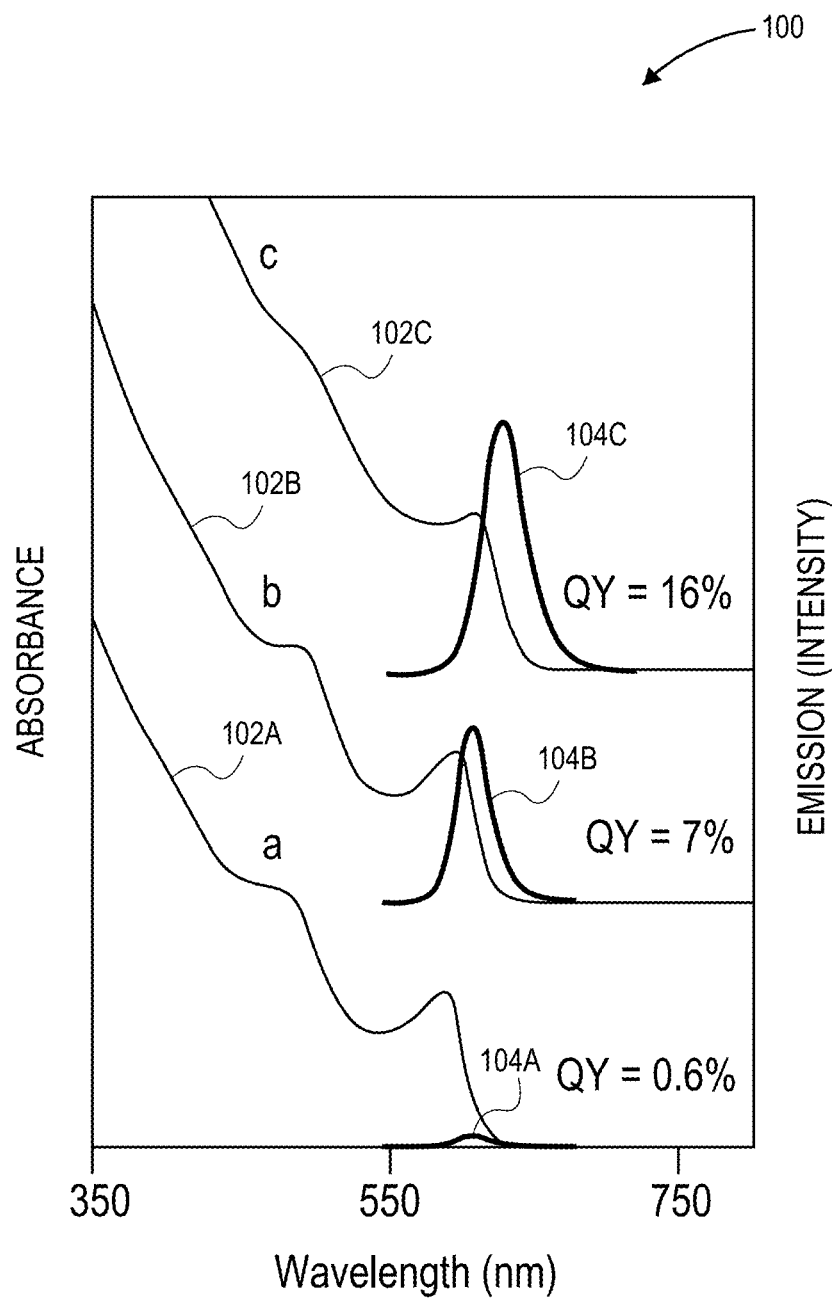
FIG. 1 depicts a plot of prior art core/shell absorption (left y-axis) and emission spectra intensity (right y-axis) as a function of wavelength for conventional quantum dots.

As an example, FIG. 1 depicts a plot 100 of prior art core/shell absorption and emission spectra intensity as a function of wavelength for conventional quantum dots. The absorption spectra (102a, 102b, 102c) are of CdSe core nanorods for a same core size with different thickness shells (a, b, c). FIG. 1 also depicts the emission spectra (104a, 104b, 104c) of the three core/shell quantum dots after exposure to laser light. The absorption spectrum and the emission spectrum overlap for each thickness of shell.

The low PLQY of prior art quantum dots is also attributed to poor nanocrystal surface and crystalline quality. The poor quality may result from a previous lack of capability in synthetic techniques for treating or tailoring the nanocrystal surface in order to achieve PLQYs above 90 percent. For example, the surface may have a large number of dangling bonds which act as trap states to reduce emission and, hence, PLQY. Previous approaches to address such issues have included use of a very thin shell, e.g., approximately ½ monolayer to 5 monolayers, or up to about 1.5 nm of thickness, to preserve the epitaxial nature of the shell. However, a PLQY of only 50-80% has been achieved. In such systems, considerable self-absorption may remain, decreasing the PLQY in many device applications. Other approaches have included attempts to grow a very large volume of up to 19 monolayers, or about 6 nm of shell material on a nanometer-sized quantum dot. However, the results have been less than satisfactory due to mismatched lattice constants between the core and shell material.

Conventionally, a spherical shell is grown on a spherical core in order to fabricate a core/shell quantum dot system. However, if too much volume of shell material is added to the core, the shell often will to crack due to strain. The strain introduces defects and decreases the PLQY. Band-edge emission from the quantum dots is then left to compete with both radiative and non-radiative decay channels, originating from defect electronic states. Attempts have been made to use an organic molecule as a passivating agent in order to improve the size-dependent band-edge luminescence efficiency, while preserving the solubility and processability of the particles. Unfortunately, however, passivation by way of organic molecule passivation is often incomplete or reversible, exposing some regions of the surface of a quantum dot to degradation effects such as photo-oxidation. In some cases, chemical degradation of the ligand molecule itself or its exchange with other ligands results in fabrication of poor quality quantum dots.

One or more embodiments of the present invention address at least one or more of the above issues regarding quantum dot quality and behavior and the impact on PLQY of the fabricated quantum dots. In one approach, the quality of quantum dot particle interfaces is improved over conventional systems. For example, in one embodiment, high PLQY temperature stability of a fabricated (e.g., grown) quantum dot is centered on the passivation or elimination of internal (at the seed/rod interface) and external (at the rod surface) interface defects that provide non-radiative recombination pathways for electron-hole pairs that otherwise compete with a desirable radiative recombination. This approach may be generally coincident with maximizing the room-temperature PLQY of the quantum dot particles. Thus, thermal escape paths from the quantum dot, assisted by quantum dot phonons, are mitigated as a primary escape mechanism for thermally excited carriers. Although the chemical or physical nature of such trap states has not been phenomenologically explored, suitably tuning electron density at the surface may deactivate trap states. Such passivation is especially important at increased temperatures, where carriers have sufficient thermal energy to access a larger manifold of these states.

In an embodiment, approaches described herein exploit the concept of trap state deactivation. Furthermore, maintenance of such a deactivation effect over time is achieved by insulating a quantum dot interface and/or outer most surface from an external environment. The deactivation of surface states is also important for the fabrication of polymer composites including quantum dots, particularly in the case where the polymer composite is exposed to a high flux light-source (as is the case for SSL) where it is possible for some of the particles to have more than one exciton. The multi-excitons may recombine radiatively or non-radiatively via Auger recombination to a single exciton state. For non-passivated quantum dot systems, the Auger rate increases with particle volume and with exciton population. However, in an embodiment, a thick, high quality, asymmetric shell of (e.g., of CdS) is grown on well-formed seeds (e.g., CdSe) to mitigate Auger rate increase.

One or more embodiments described herein involve an optimized synthesis of core/shell quantum dots. In a specific example, high PLQY and temperature stable quantum dots are fabricated from CdSe/CdS core-shell nanorods. In order to optimize the quantum dots in place of light emitting diode (LED) phosphors, the temperature stability of the quantum dots is enhanced, and the overall PLQY increased. Such improved performance is achieved while maintaining high absorption and narrow emission profiles for the quantum dots. In one such embodiment, materials systems described herein are tailored for separate optimization of absorption and emission by employing a core/shell structure. The core material predominantly controls the emission and the shell material predominantly controls the absorption. The described systems enable separate optimization of absorption and emission and provides very little overlap of the absorption and emission to minimize re-absorption of any emitted light by the quantum dot material (i.e., self-absorption).

Figure 2:
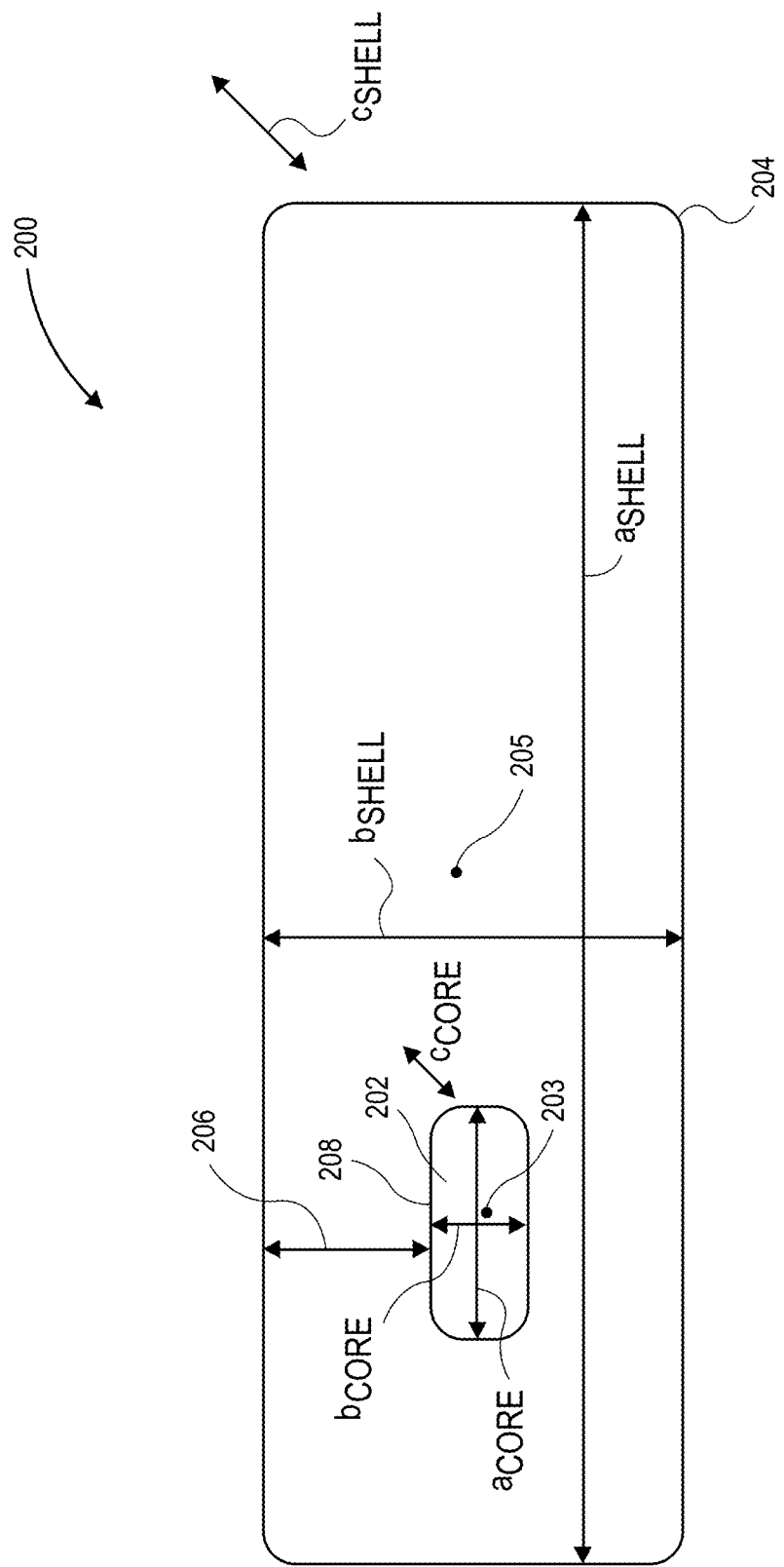
FIG. 2 illustrates a schematic of a cross-sectional view of a quantum dot, in accordance with an embodiment of the present invention.

Several factors may be intertwined for establishing an optimized geometry for a quantum dot having a nanocrystalline core and naocrystalline shell pairing. As a reference, FIG. 2 illustrates a schematic of a cross-sectional view of a quantum dot, in accordance with an embodiment of the present invention. Referring to FIG. 2, a semiconductor structure (e.g., a quantum dot structure) 200 includes a nanocrystalline core 202 surrounded by a nanocrystalline shell 204. The nanocrystalline core 202 has a length axis ($a_{CORE}$), a width axis ($b_{CORE}$) and a depth axis ($c_{CORE}$), the depth axis provided into and out of the plane shown in FIG. 2. Likewise, the nanocrystalline shell 204 has a length axis ($a_{SHELL}$), a width axis ($b_{SHELL}$) and a depth axis ($c_{SHELL}$), the depth axis provided into and out of the plane shown in FIG. 2. The nanocrystalline core 202 has a center 203 and the nanocrystalline shell 204 has a center 205. The nanocrystalline shell 204 surrounds the nanocrystalline core 202 in the b-axis direction by an amount 206, as is also depicted in FIG. 2.

The following are attributes of a quantum dot that may be tuned for optimization, with reference to the parameters provided in FIG. 2, in accordance with embodiments of the present invention. Nanocrystalline core 202 diameter (a, b or c) and aspect ratio (e.g., a/b) can be controlled for rough tuning for emission wavelength (a higher value for either providing increasingly red emission). A smaller overall nanocrystalline core provides a greater surface to volume ratio. The width of the nanocrystalline shell along 206 may be tuned for yield optimization and quantum confinement providing approaches to control red-shifting and mitigation of surface effects. However, strain considerations must be accounted for when optimizing the value of thickness 206. The length ($a_{SHELL}$) of the shell is tunable to provide longer radiative decay times as well as increased light absorption. The overall aspect ratio of the structure 200 (e.g., the greater of $a_{SHELL}/b_{SHELL}$ and $a_{SHELL}/c_{SHELL}$) may be tuned to directly impact PLQY. Meanwhile, overall surface/volume ratio for 200 may be kept relatively smaller to provide lower surface defects, provide higher photoluminescence, and limit self-absorption. Referring again to FIG. 2, the shell/core interface 207 may be tailored to avoid dislocations and strain sites. In one such embodiment, a high quality interface is obtained by tailoring one or more of injection temperature and mixing parameters, the use of surfactants, and control of the reactivity of precursors, as is described in greater detail below.

In accordance with an embodiment of the present invention, a high PLQY quantum dot is based on a core/shell pairing using an anisotropic core. With reference to FIG. 2, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nanocrystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nanocrystalline core composed of a first semiconductor material and having an aspect ratio between, but not including, 1.0 and 2.0. The semiconductor structure also includes a nanocrystalline shell composed of a second, different, semiconductor material at least partially surrounding the anisotropic nanocrystalline core. In one such embodiment, the aspect ratio of the anisotropic nanocrystalline core is approximately in the range of 1.01-1.2 and, in a particular embodiment, is approximately in the range of 1.1-1.2. In the case of rounded edges, then, the nanocrystalline core may be substantially, but not perfectly, spherical. However, the nanocrystalline core may instead be faceted. In an embodiment, the anisotropic nanocrystalline core is disposed in an asymmetric orientation with respect to the nanocrystalline shell, as described in greater detail in the example below.

Another consideration for maximization of PLQY in a quantum dot structure is to provide an asymmetric orientation of the core within a surrounding shell. For example, referring again to FIG. 2, the center 203 of the core 202 may be misaligned with (e.g., have a different spatial point than) the center 205 of the shell 202. In an embodiment, a semiconductor structure includes an anisotropic nanocrystalline core composed of a first semiconductor material. The semiconductor structure also includes a nanocrystalline shell composed of a second, different, semiconductor material at least partially surrounding the anisotropic nanocrystalline core. The anisotropic nanocrystalline core is disposed in an asymmetric orientation with respect to the nanocrystalline shell. In one such embodiment, the nanocrystalline shell has a long axis (e.g., $a_{SHELL}$), and the anisotropic nanocrystalline core is disposed off-center along the long axis. In another such embodiment, the nanocrystalline shell has a short axis (e.g., $b_{SHELL}$), and the anisotropic nanocrystalline core is disposed off-center along the short axis. In yet another embodiment, however, the nanocrystalline shell has a long axis (e.g., $a_{SHELL}$) and a short axis (e.g., $b_{SHELL}$), and the anisotropic nanocrystalline core is disposed off-center along both the long and short axes.

With reference to the above described nanocrystalline core and nanocrystalline shell pairings, in an embodiment, the nanocrystalline shell completely surrounds the anisotropic nanocrystalline core. In an alternative embodiment, however, the nanocrystalline shell only partially surrounds the anisotropic nanocrystalline core, exposing a portion of the anisotropic nanocrystalline core, e.g., as in a tetrapod geometry or arrangement. In an embodiment, the nanocrystalline shell is an anisotropic nanocrystalline shell, such as a nano-rod, that surrounds the anisotropic nanocrystalline core at an interface between the anisotropic nanocrystalline shell and the anisotropic nanocrystalline core. The anisotropic nanocrystalline shell passivates or reduces trap states at the interface. The anisotropic nanocrystalline shell may also, or instead, deactivate trap states at the interface.

With reference again to the above described nanocrystalline core and nanocrystalline shell pairings, in an embodiment, the first and second semiconductor materials (core and shell, respectively) are each materials such as, but not limited to, Group II-VI materials, Group III-V materials, Group IV-VI materials, Group materials, or Group II-IV-VI materials and, in one embodiment, are monocrystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nanocrystalline outer shell at least partially surrounding the nanocrystalline shell and, in one embodiment, the nanocrystalline outer shell completely surrounds the nanocrystalline shell. The nanocrystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS).

With reference again to the above described nanocrystalline core and nanocrystalline shell pairings, in an embodiment, the semiconductor structure (i.e., the core/shell pairing in total) has an aspect ratio approximately in the range of 1.5-10 and, 3-6 in a particular embodiment. In an embodiment, the nanocrystalline shell has a long axis and a short axis. The long axis has a length approximately in the range of 5-40 nanometers. The short axis has a length approximately in the range of 1-5 nanometers greater than a diameter of the anisotropic nanocrystalline core parallel with the short axis of the nanocrystalline shell. In a specific such embodiment, the anisotropic nanocrystalline core has a diameter approximately in the range of 2-5 nanometers. In another embodiment, the anisotropic nanocrystalline core has a diameter approximately in the range of 2-5 nanometers. The thickness of the nanocrystalline shell on the anisotropic nanocrystalline core along a short axis of the nanocrystalline shell is approximately in the range of 1-5 nanometers of the second semiconductor material.

With reference again to the above described nanocrystalline core and nanocrystalline shell pairings, in an embodiment, the anisotropic nanocrystalline core and the nanocrystalline shell form a quantum dot. In one such embodiment, the quantum dot has a photoluminescence quantum yield (PLQY) of at least 90%. Emission from the quantum dot may be mostly, or entirely, from the nanocrystalline core. For example, in an embodiment, emission from the anisotropic nanocrystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nanocrystalline core and nanocrystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of color semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color.

Semiconductor structures according to embodiments of the present invention may be advantageously used in biological imaging in, e.g., one or more of the following environments: fluorescence resonance energy transfer (FRET) analysis, gene technology, fluorescent labeling of cellular proteins, cell tracking, pathogen and toxin detection, in vivo animal imaging or tumor biology investigation. Accordingly, embodiments of the present invention contemplate probes having quantum dots described herein.

Semiconductor structures according to embodiments of the present invention may be advantageously used in photovoltaic cells in layers where high PLQY is important. Accordingly, embodiments of the present invention contemplate photovoltaic devices using quantum dots described herein.

There are various synthetic approaches for fabricating CdSe quantum dots. For example, in an embodiment, under an inert atmosphere (e.g., ultra high purity (UHP) argon), cadmium oxide (CdO) is dissociated in the presence of surfactant (e.g., octadecylphosphonic acid (ODPA)) and solvent (e.g., trioctylphosphine oxide (TOPO); trioctylphosphine (TOP)) at high temperatures (e.g., 350-380 degrees Celsius). Resulting $Cd^{2+}$ cations are exposed by rapid injection to solvated selenium anions ($Se^{2-}$), resulting in a nucleation event forming small CdSe seeds. The seeds continue to grow, feeding off of the remaining $Cd^{2+}$ and $Se^{2-}$ available in solution, with the resulting quantum dots being stabilized by surface interactions with the surfactant in solution (ODPA). The aspect ratio of the CdSe seeds is typically between 1 and 2, as dictated by the ratio of the ODPA to the Cd concentration in solution. The quality and final size of these cores is affected by several variables such as, but not limited to, reaction time, temperature, reagent concentration, surfactant concentration, moisture content in the reaction, or mixing rate. The reaction is targeted for a narrow size distribution of CdSe seeds (assessed by transmission electron microscopy (TEM)), typically a slightly cylindrical seed shape (also assessed by TEM) and CdSe seeds exhibiting solution stability over time (assessed by PLQY and scattering in solution).

For the cadmium sulfide (CdS) shell growth on the CdSe seeds, or nanocrystalline cores, under an inert atmosphere (e.g. UHP argon), cadmium oxide (CdO) is dissociated in the presence of surfactants (e.g., ODPA and hexylphosphonic acid (HPA)) and solvent (e.g. TOPO and/or TOP) at high temperatures (e.g., 350-380 degrees Celsius). The resulting $Cd^{2+}$ cations in solution are exposed by rapid injection to solvated sulfur anions ($S^{2-}$) and CdSe cores. Immediate growth of the CdS shell around the CdSe core occurs. The use of both a short chain and long chain phosphonic acid promotes enhanced growth rate at along the c-axis of the structure, and slower growth along the a-axis, resulting in a rod-shaped core/shell nanomaterial.

CdSe/CdS core-shell quantum dots have been shown in the literature to exhibit respectable quantum yields (e.g., 70-75%). However, the persistence of surface trap states (which decrease overall photoluminescent quantum yield) in these systems arises from a variety of factors such as, but not limited to, strain at the core-shell interface, high aspect ratios (ratio of rod length to rod width of the core/shell pairing) which lead to larger quantum dot surface area requiring passivation, or poor surface stabilization of the shell.

In order to address the above synthetic limitations on the quality of quantum dots formed under conventional synthetic procedures, in an embodiment, a multi-faceted approach is used to mitigate or eliminate sources of surface trap states in quantum dot materials. For example, lower reaction temperatures during the core/shell pairing growth yields slower growth at the CdSe-CdS interface, giving each material sufficient time to orient into the lowest-strain positions. Aspect ratios are controlled by changing the relative ratios of surfactants in solution as well as by controlling temperature. Increasing an ODPA/HPA ratio in reaction slows the rapid growth at the ends of the core/shell pairings by replacing the facile HPA surfactant with the more obstructive ODPA surfactant. In addition, lowered reaction temperatures are also used to contribute to slowed growth at the ends of the core/shell pairings. By controlling these variables, the aspect ratio of the core/shell pairing is optimized for quantum yield. In one such embodiment, following determination of optimal surfactant ratios, overall surfactant concentrations are adjusted to locate a PLQY maximum while maintaining long-term stability of the fabricated quantum dots in solution. Furthermore, in an embodiment, aspect ratios of the seed or core (e.g., as opposed to the seed/shell pairing) are limited to a range between, but not including 1.0 and 2.0 in order to provide an appropriate geometry for high quality shell growth thereon.

In another aspect, an additional or alternative strategy for improving the interface between CdSe and CdS includes, in an embodiment, chemically treating the surface of the CdSe cores prior to reaction. CdSe cores are stabilized by long chain surfactants (ODPA) prior to introduction into the CdS growth conditions. Reactive ligand exchange can be used to replace the ODPA surfactants with ligands which are easier to remove (e.g., primary or secondary amines), facilitating improved reaction between the CdSe core and the CdS growth reagents.

In addition to the above factors affecting PLQY in solution, self-absorption may negatively affect PLQY when these materials are cast into films. This phenomenon may occur when CdSe cores re-absorb light emitted by other quantum dots. In one embodiment, the thickness of the CdS shells around the same CdSe cores is increased in order to increase the amount of light absorbed per core/shell pairing, while keeping the particle concentration the same or lower in films including the quantum dot structures. The addition of more Cd and S to the shell formation reaction leads to more shell growth, while an optimal surfactant ratio allows targeting of a desired aspect ratio and solubility of the core/shell pairing.

Accordingly, in an embodiment, an overall method of fabricating a semiconductor structure, such as the above described quantum dot structures, includes forming an anisotropic nanocrystalline core from a first semiconductor material. A nanocrystalline shell is formed from a second, different, semiconductor material to at least partially surround the anisotropic nanocrystalline core. In one such embodiment, the anisotropic nanocrystalline core has an aspect ratio between, but not including, 1.0 and 2.0, as described above.

With reference to the above described general method for fabricating a nanocrystalline core and nanocrystalline shell pairing, in an embodiment, prior to forming the nanocrystalline shell, the anisotropic nanocrystalline core is stabilized in solution with a surfactant. In one such embodiment, the surfactant is octadecylphosphonic acid (ODPA). In another such embodiment, the surfactant acts as a ligand for the anisotropic nanocrystalline core. In that embodiment, the method further includes, prior to forming the nanocrystalline shell, replacing the surfactant ligand with a second ligand, the second ligand more labile than the surfactant ligand. In a specific such embodiment, the second ligand is one such as, but not limited to, a primary amine or a secondary amine.

With reference again to the above described general method for fabricating a nanocrystalline core and nanocrystalline shell pairing, in an embodiment, forming the nanocrystalline shell includes forming the second semiconductor material in the presence of a mixture of surfactants. In one such embodiment, the mixture of surfactants includes a mixture of octadecylphosphonic acid (ODPA) and hexylphosphonic acid (HPA). In a specific such embodiment, forming the nanocrystalline shell includes tuning the aspect ratio of the nanocrystalline shell by tuning the ratio of ODPA versus HPA. Forming the second semiconductor material in the presence of the mixture of surfactants may also, or instead, include using a solvent such as, but not limited to, trioctylphosphine oxide (TOPO) and trioctylphosphine (TOP).

With reference again to the above described general method for fabricating a nanocrystalline core and nanocrystalline shell pairing, in an embodiment, forming the anisotropic nanocrystalline core includes forming at a temperature approximately in the range of 350-380 degrees Celsius. In an embodiment, forming the anisotropic nanocrystalline core includes forming a cadmium selenide (CdSe) nanocrystal from cadmium oxide (CdO) and selenium (Se) in the presence of a surfactant at a temperature approximately in the range of 300-400 degrees Celsius. The reaction is arrested prior to completion. In one such embodiment, forming the nanocrystalline shell includes forming a cadmium sulfide (CdS) nanocrystalline layer on the CdSe nanocrystal from cadmium oxide (CdO) and sulfur (S) at a temperature approximately in the range of 120-380 degrees Celsius. That reaction is also arrested prior to completion.

The aspect ratio of the fabricated semiconductor structures may be controlled by one of several methods. For example, ligand exchange may be used to change the surfactants and/or ligands and alter the growth kinetics of the shell and thus the aspect ratio. Changing the core concentration during core/shell growth may also be exploited. An increase in core concentration and/or decrease concentration of surfactants results in lower aspect ratio core/shell pairings. Increasing the concentration of a shell material such as S for CdS will increase the rate of growth on the ends of the core/shell pairings, leading to longer, higher aspect ratio core/shell pairings.

As mentioned above, in one embodiment of the present invention, nanocrystalline cores undergo a reactive ligand exchange which replaces core surfactants with ligands that are easier to remove (e.g., primary or secondary amines), facilitating better reaction between the CdSe core and the CdS growth reagents. In one embodiment, cores used herein have ligands bound or associated therewith. Attachment may be by dative bonding, Van der Waals forces, covalent bonding, ionic bonding or other force or bond, and combinations thereof. Ligands used with the cores may include one or more functional groups to bind to the surface of the nanocrystals. In a specific such embodiment, the ligands have a functional group with an affinity for a hydrophobic solvent.

In an embodiment, lower reaction temperatures during shell growth yields slower growth at the core/shell interface. While not wishing to be bound by any particular theory or principle it is believed that this method allows both core and shell seed crystals time to orient into their lowest-strain positions during growth. Growth at the ends of the core/shell pairing structure is facile and is primarily governed by the concentration of available precursors (e.g., for a shell of CdS this is Cd, S:TOP). Growth at the sides of the core/shell pairings is more strongly affected by the stabilizing ligands on the surface of the core/shell pairing. Ligands may exist in equilibrium between the reaction solution and the surface of the core/shell pairing structure. Lower reaction temperatures may tilt this equilibrium towards more ligands being on the surface, rendering it more difficult for growth precursors to access this surface. Hence, growth in the width direction is hindered by lower temperature, leading to higher aspect ratio core/shell pairings.

In general consideration of the above described semiconductor or quantum dot structures and methods of fabricating such semiconductor or quantum dot structures, in an embodiment, quantum dots are fabricated to have an absorbance in the blue or ultra-violet (V) regime, with an emission in the visible (e.g., red, orange, yellow, green, blue, indigo and violet, but particularly red and green) regime. The above described quantum dots may advantageously have a high PLQY with limited self-absorption, possess a narrow size distribution for cores, provide core stability over time (e.g., as assessed by PLQY and scattering in solution), and exhibit no major product loss during purification steps. Quantum dots fabricated according one or more of the above embodiments may have a decoupled absorption and emission regime, where the absorption is controlled by the shell and the emission is controlled by the core. In one such embodiment, the diameter of the core correlates with emission color, e.g., a core diameter progressing from 3-5.5 nanometers correlates approximately to a green yellow red emission progression.

With reference to the above described embodiments concerning semiconductor structures, such as quantum dots, and methods of fabricating such structures, the concept of a crystal defect, or mitigation thereof, may be implicated. For example, a crystal defect may form in, or be precluded from forming in, a nanocrystalline core or in a nanocrystalline shell, at an interface of the core/shell pairing, or at the surface of the core or shell. In an embodiment, a crystal defect is a departure from crystal symmetry caused by on or more of free surfaces, disorder, impurities, vacancies and interstitials, dislocations, lattice vibrations, or grain boundaries. Such a departure may be referred to as a structural defect or lattice defect. Reference to an exciton is to a mobile concentration of energy in a crystal formed by an excited electron and an associated hole. An exciton peak is defined as the peak in an absorption spectrum correlating to the minimum energy for a ground state electron to cross the band gap. The core/shell quantum dot absorption spectrum appears as a series of overlapping peaks that get larger at shorter wavelengths. Because of their discrete electron energy levels, each peak corresponds to an energy transition between discrete electron-hole (exciton) energy levels. The quantum dots do not absorb light that has a wavelength longer than that of the first exciton peak, also referred to as the absorption onset. The wavelength of the first exciton peak, and all subsequent peaks, is a function of the composition and size of the quantum dot. An absorbance ratio is absorbance of the core/shell nanocrystal at 400 nm divided by the absorbance of the core/shell nanocrystal at the first exciton peak. Photoluminescence quantum yield (PLQY) is defined as the ratio of the number of photons emitted to the number of photons absorbed. Core/shell pairing described herein may have a Type 1 band alignment, e.g., the core band gap is nested within the band gap of the shell. Emission wavelength may be determined by controlling the size and shape of the core nanocrystal, which controls the band gap of the core. Emission wavelength may also be engineered by controlling the size and shape of the shell. In an embodiment, the amount/volume of shell material is much greater than that of the core material. Consequently, the absorption onset wavelength is mainly controlled by the shell band gap. Core/shell quantum dots in accordance with an embodiment of the present invention have an electron-hole pair generated in the shell which is then funneled into the core, resulting in recombination and emission from the core quantum dot. Preferably emission is substantially from the core of the quantum dot.

Figure 3:
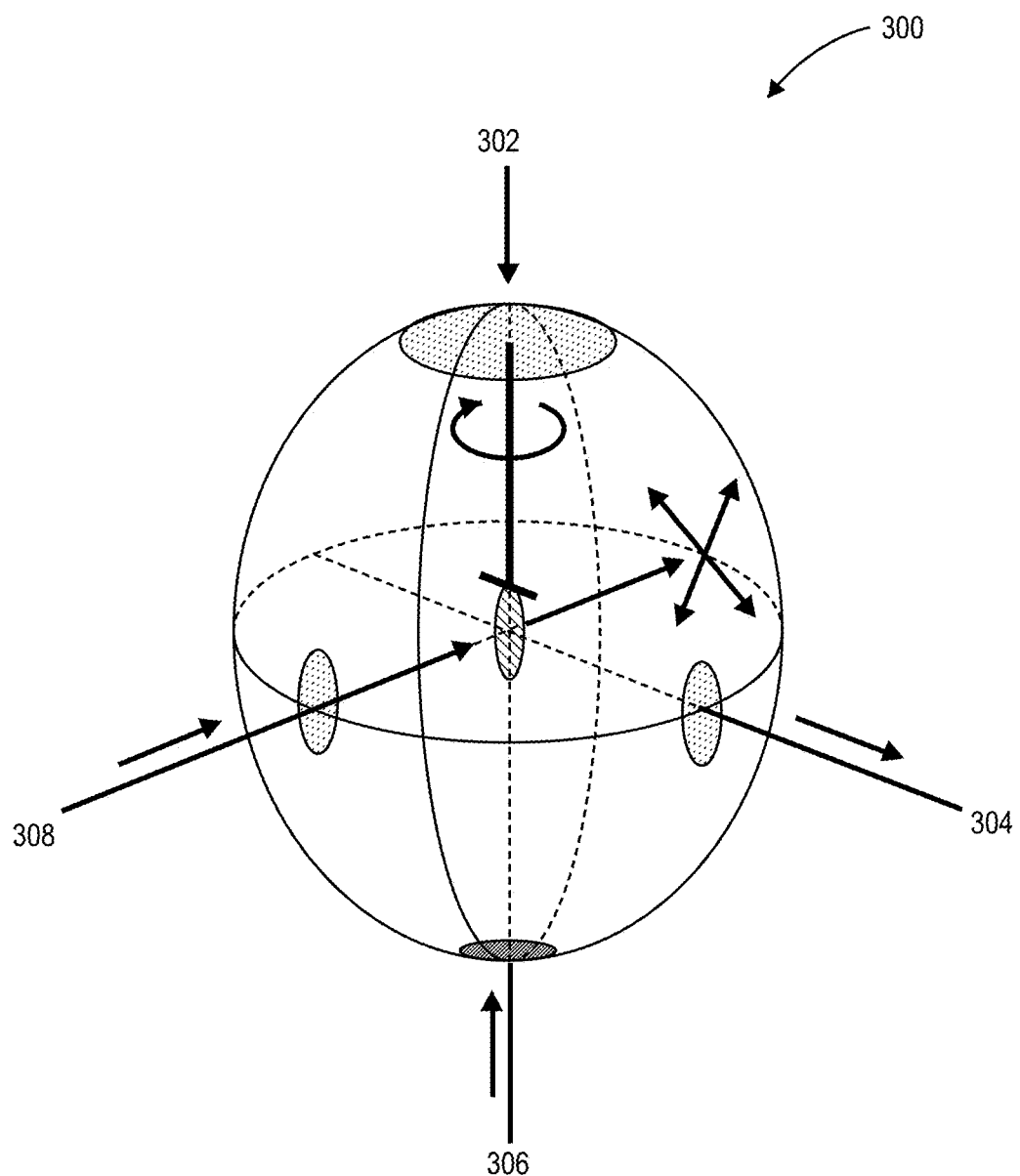
FIG. 3 illustrates a schematic of an integrating sphere for measuring absolute photoluminescence quantum yield, in accordance with an embodiment of the present invention.
Figure 4:
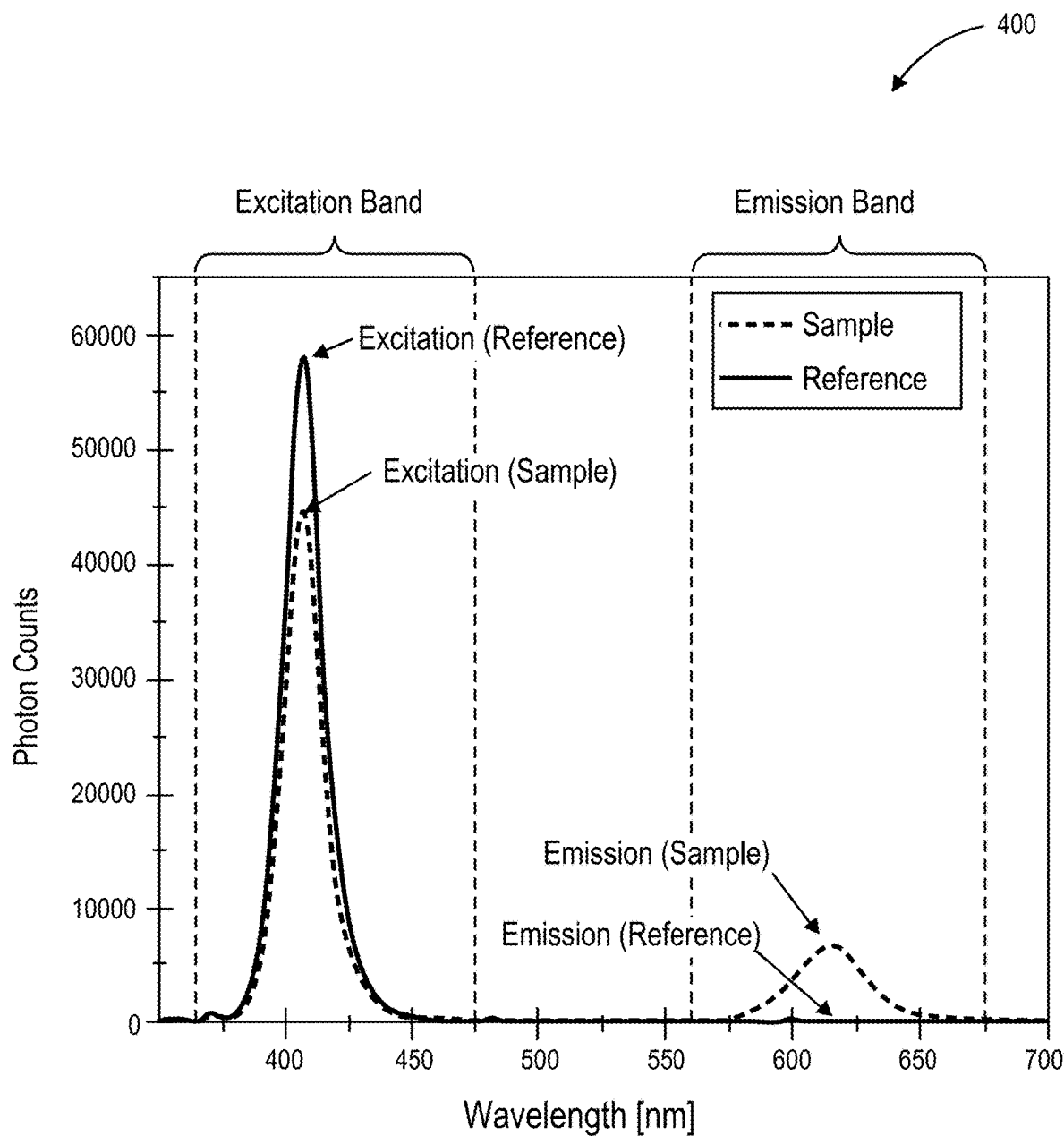
FIG. 4 is a plot of photon counts as a function of wavelength in nanometers for sample and reference emission spectra used in the measurement of photoluminescence quantum yield, in accordance with an embodiment of the present invention.

Measurement of Photoluminescence Quantum Yield (PLQY) may be performed according to the method disclosed in Laurent Porres et al. "Absolute Measurements of Photoluminescence Quantum Yields of Solutions Using an Integrating Sphere", *Journal of Fluorescence* (2006) DOI: 10.1007/s10895-005-0054-8, Springer Science+Business Media, Inc. As an example, FIG. 3 illustrates a schematic of an integrating sphere 300 for measuring absolute photoluminescence quantum yield, in accordance with an embodiment of the present invention. The integrating sphere 300 includes a sample holder 302, a spectrometer 304, a calibrated light source 306 and an ultra-violet (UV) LED 308. FIG. 4 is a plot 400 of photon counts as a function of wavelength in nanometers for sample and reference emission spectra used in the measurement of photoluminescence quantum yield, in accordance with an embodiment of the present invention. Referring to plot 400, both excitation and emission peaks for a sample are calibrated against corresponding excitation and emission peaks for a reference.

In an embodiment, PLQY is measured with a Labsphere™ 6" integrating sphere, a Labsphere™ LPS-100-0105 calibrated white light source, a 3.8 W, 405 nm Thorlabs™ M405L2 UV LED and an Ocean Optics™ USB4000-VIS-NIR spectrometer. The spectrometer and UV LED are coupled into the sphere using Ocean Optics™ UV-Vis optical fibers. The spectrometer fiber is attached to a lens in a port at the side of the sphere at 90 degrees relative to the excitation source. The lens is behind a flat baffle to ensure only diffuse light reaches the lens. The calibrated white light source is affixed to a port in the side of the sphere, at 90° to both the excitation source and the spectrometer port. Custom made sample holders are used to hold solid and solution (cuvette) samples and to rotate samples between direct and indirect measurement positions. Sample holders are coated with a barium sulfate diffuse reflective material. Before measurements are recorded, the calibrated white light source is used to calibrate the spectrometer as a function of wavelength (translating counts per second into relative intensity vs. wavelength). To measure PLQY, a reference sample is inserted into the sphere, and the excitation source LED signal is recorded. This reference sample is generally a blank, such as a cuvette containing a solvent or a sample without quantum dots, so as to only measure the properties of the quantum dots. If it is desirable to measure the properties of the matrix, the blank may be only the substrate. The sample is then inserted into the sphere, in direct beam line for direct measurements, and out of the beam for indirect measurements. The spectrum is recorded and split into excitation and emission bands, each is integrated, and the number of photons emitted per photons absorbed is the photoluminescence quantum yield (PLQY), which is equal to the difference between sample emission and reference emission divided by the difference of reference excitation and sample excitation.

Figure 5:
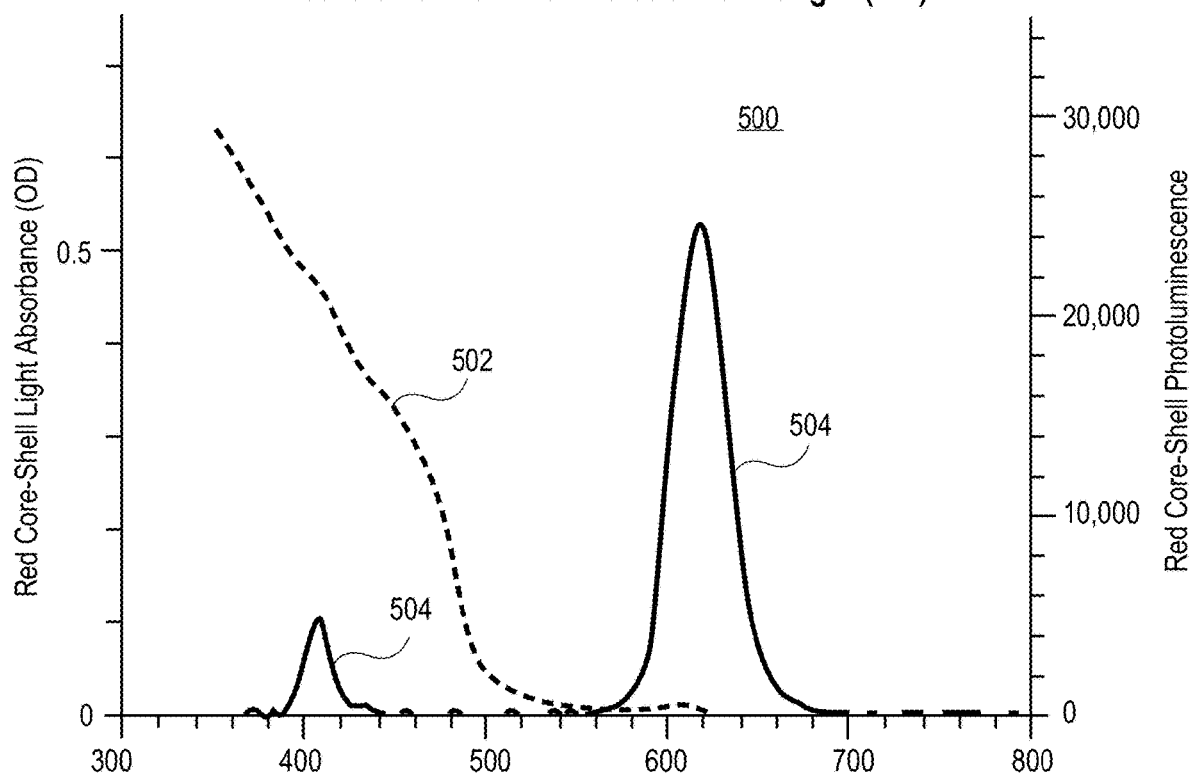
FIG. 5 is a plot including a UV-Vis absorbance spectrum and photoluminescent emission spectrum for red CdSe/CdS core/shell quantum dots, in accordance with an embodiment of the present invention.
Figure 6:
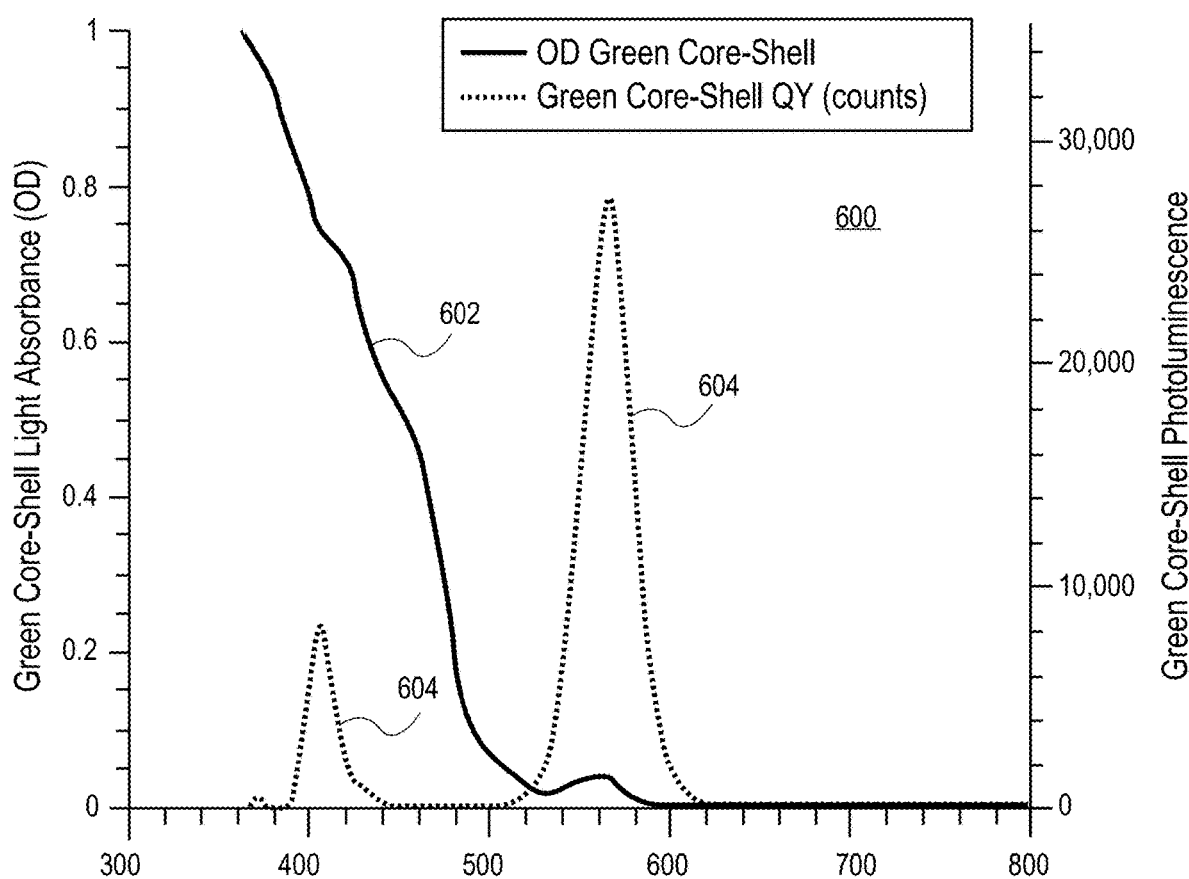
FIG. 6 is a plot including a UV-Vis absorbance spectrum and photoluminescent emission spectrum for a green CdSe/CdS core/shell quantum dot, in accordance with an embodiment of the present invention.

Quantum dots according to embodiments of the present invention have a PLQY between 90-100%, or at least 90%, more preferably at least 91%, more preferably at least 92%, more preferably at least 93%, more preferably at least 94%, more preferably at least 95%, more preferably at least 96%, more preferably at least 97%, more preferably at least 98%, more preferably at least 99% and most preferably 100%. FIG. 5 is a plot 500 including a UV-Vis absorbance spectrum 502 and photoluminescent emission spectrum 504 for red CdSe/CdS core/shell quantum dots, in accordance with an embodiment of the present invention. The quantum dots have essentially no overlapping absorption and emission bands and having an absorbance ratio of about 24. The PLQY was determined to be 94% at 617 nm. The average length (from transmission electron microscopy (TEM) data) is 27 nm±3.3 nm. The average width (from TEM data) is 7.9 nm±1.1 nm. The average aspect ratio (from TEM data) is 3.5±0.6. FIG. 6 is a plot 600 including a UV-Vis absorbance spectrum 602 and photoluminescent emission spectrum 604 for a green CdSe/CdS core/shell quantum dot, in accordance with an embodiment of the present invention. The quantum dot has a small extent of overlapping absorption and emission bands and has an absorbance ratio of 16 (plus or minus one).

In another aspect, semiconductor structures having a nanocrystalline core and corresponding nanocrystalline shell and insulator coating are described. Particularly, coated quantum dots structures and methods of making such structures are described below. In an embodiment, core/shell quantum dots are coated with silica by a method resulting in compositions having photoluminescence quantum yields between 90 and 100%. In one such embodiment, semiconductor structures are coated with silica using a reverse micelle method. A quantum dot may be engineered so that emission is substantially from the core.

Prior art quantum dots may have poor nanocrystal surface and crystalline quality as a result of prior art synthetic techniques not being capable of treating the nanocrystal surface in ways capable of achieving PLQYs above 90 percent. For example, the surface of a nanocrystalline core/shell pairing may have a large number of dangling bonds which act as trap states reducing emission and, therefore, PLQY. Prior art techniques to modify the quantum dot surface include coating quantum dots with silica. However, prior art silica coated quantum dots do not achieve the PLQY necessary for continued use in solid state lighting devices.

In conventional approaches, silica coatings can encapsulate more than one particle (e.g., quantum dot structure) at a time, or the approaches have resulted in incomplete encapsulation. One such conventional approach included coating a quantum dot with silica using self-assembled micelles. The approach requires the presence of a majority of a polar solvent to form a micelle. The requirement is for polar solvent environments to generate the encapsulating micelle, and thus limits the technique to aqueous based applications, such as biological tagging and imaging. Quantum dots with a hydrophobic surfactant or ligand attached are aqueous solution insoluble and thus silica cannot be precipitated with the nanocrystals within the aqueous domains of the micro emulsion. Ligand exchange reactions may be required which then leads to surface quality degradation. However, conventional quantum dot systems often rely on the weak dative Van der Waals bonding of ligands such as phosphonic acids, amines, and carboxylic acids to maintain the structures in solution and protect and passivate the surface of the quantum dot.

The integration of a quantum dot into a product may require protection for chemically compatibility with the solution environment during processing, and ultimately the plastic or gel used for encapsulation. Without such compatibility, particles are likely to aggregate and/or redistribute themselves within the matrix, an unacceptable occurrence in, for example, a solid state lighting product. Protection of the surface and maintenance of an electronically uniform environment also ensures that the density of non-radiative pathways (traps) is minimized, and that the emission energy (color) is as uniform as possible. Furthermore, the surface is protected from further chemical reaction with environmental degradants such as oxygen. This is particularly important for LED applications, where the quantum dot must tolerate temperatures as high as 200 degrees Celsius and constant high-intensity illumination with high-energy light. However, the weak surface bonding of prior art quantum dot ligands are non-ideal for the processing and long-term performance required of an LED product, as they allow degradants access to the quantum dot surface.

In accordance with an embodiment of the present invention, core/shell quantum dots coated with silica and other ligands to provide a structure having a high PLQY. One embodiment exploits a sol-gel process which encapsulates each quantum dot individually in a silica shell, resulting in a very stable high PLQY quantum dot particle. The coated quantum dots disclosed herein may advantageously possess a narrow size distribution for CdSe core stability over time (assessed by PLQY and scattering in solution).

In a general embodiment, a semiconductor structure includes a nanocrystalline core composed of a first semiconductor material. The semiconductor structure also includes a nanocrystalline shell composed of a second, different, semiconductor material at least partially surrounding the nanocrystalline core. An insulator layer encapsulates, e.g., coats, the nanocrystalline shell and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the nanocrystalline shell. In an embodiment, the nanocrystalline core and the nanocrystalline shell form a quantum dot.

With reference to the above described coated nanocrystalline core and nanocrystalline shell pairings, in an embodiment, the insulator layer is bonded directly to the nanocrystalline shell. In one such embodiment, the insulator layer passivates an outermost surface of the nanocrystalline shell. In another embodiment, the insulator layer provides a barrier for the nanocrystalline shell and nanocrystalline core impermeable to an environment outside of the insulator layer. In any case, the insulator layer may encapsulate only a single nanocrystalline shell/nanocrystalline core pairing. In an embodiment, the semiconductor structure further includes a nanocrystalline outer shell at least partially surrounding the nanocrystalline shell, between the nanocrystalline shell and the insulator layer. The nanocrystalline outer shell is composed of a third semiconductor material different from the semiconductor material of the shell and, possibly, different from the semiconductor material of the core.

With reference again to the above described coated nanocrystalline core and nanocrystalline shell pairings, in an embodiment, the insulator layer is composed of a layer of material such as, but not limited to, silica ($SiO_x$), titanium oxide ($TiO_x$), zirconium oxide ($ZrO_x$), alumina ($AlO_x$), or hafnia ($HfO_x$). In one such embodiment, the layer is a layer of silica having a thickness approximately in the range of 3-30 nanometers. In an embodiment, the insulator layer is an amorphous layer.

With reference again to the above described coated nanocrystalline core and nanocrystalline shell pairings, in an embodiment, an outer surface of the insulator layer is ligand-free. However, in an alternative embodiment, an outer surface of the insulator layer is ligand-functionalized. In one such embodiment, the outer surface of the insulator layer is ligand-functionalized with a ligand such as, but not limited to, a silane having one or more hydrolyzable groups or a functional or non-functional bipodal silane. In another such embodiment, the outer surface of the insulator layer is ligand-functionalized with a ligand such as, but not limited to, mono-, di-, or tri-alkoxysilanes with three, two or one inert or organofunctional substituents of the general formula $(R^1O)_3SiR^2$; $(R^1O)_2SiR^2R^3$; $(R^1O) SiR^2R^3R^4$, where $R^1$ is methyl, ethyl, propyl, isopropyl, or butyl, $R^2$, $R^3$ and $R^4$ are identical or different and are H substituents, alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a silane with the general structure $(R^1O)_3Si$—$(CH_2)_n$—$R$—$(CH_2)_n$—$Si(RO)_3$ where R and $R^1$ is H or an organic substituent selected from the group consisting of alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a chlorosilane, or an azasilane. In another such embodiment, the outer surface of the insulator layer is ligand-functionalized with a ligand such as, but not limited to, organic or inorganic compounds with functionality for bonding to a silica surface by chemical or non-chemical interactions such as but not limited to covalent, ionic, H-bonding, or Van der Waals forces. In yet another such embodiment, the outer surface of the insulator layer is ligand-functionalized with a ligand such as, but not limited to, the methoxy and ethoxy silanes $(MeO)_3SiAllyl$, $(MeO)_3SiVinyl$, $(MeO)_2SiMeVinyl$, $(EtO)_3SiVinyl$, $EtOSi(Vinyl)_3$, mono-methoxy silanes, chloro-silanes, or 1,2-bis-(triethoxysilyl)ethane. In any case, in an embodiment, the outer surface of the insulator layer is ligand-functionalized to impart solubility, dispersability, heat stability, photostability, or a combination thereof, to the semiconductor structure. For example, in one embodiment, the outer surface of the insulator layer includes OH groups suitable for reaction with an intermediate linker to link small molecules, oligomers, polymers or macromolecules to the outer surface of the insulator layer, the intermediate linker one such as, but not limited to, an epoxide, a carbonyldiimidazole, a cyanuric chloride, or an isocyanate.

With reference again to the above described coated nanocrystalline core and nanocrystalline shell pairings, in an embodiment, the nanocrystalline core has a diameter approximately in the range of 2-5 nanometers. The nanocrystalline shell has a long axis and a short axis, the long axis having a length approximately in the range of 5-40 nanometers, and the short axis having a length approximately in the range of 1-5 nanometers greater than the diameter of the nanocrystalline core. The insulator layer has a thickness approximately in the range of 1-20 nanometers along an axis co-axial with the long axis and has a thickness approximately in the range of 3-30 nanometers along an axis co-axial with the short axis.

A lighting apparatus may include a light emitting diode and a plurality of semiconductor structures which, e.g., act to down convert light absorbed from the light emitting diode. For example, in one embodiment, each semiconductor structure includes a quantum dot having a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. An insulator layer encapsulates each quantum dot.

As described briefly above, an insulator layer may be formed to encapsulate a nanocrystalline shell and anisotropic nanocrystalline core. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercaptotrimethoxysilane, or a silane comprising a phosphonic acid or carboxylic acid functional group, to a second solution having a surfactant dissolved in a second non-polar solvent. Subsequently, ammonium hydroxide and tetraorthosilicate (TEOS) are added to the second solution.

Figure 7:
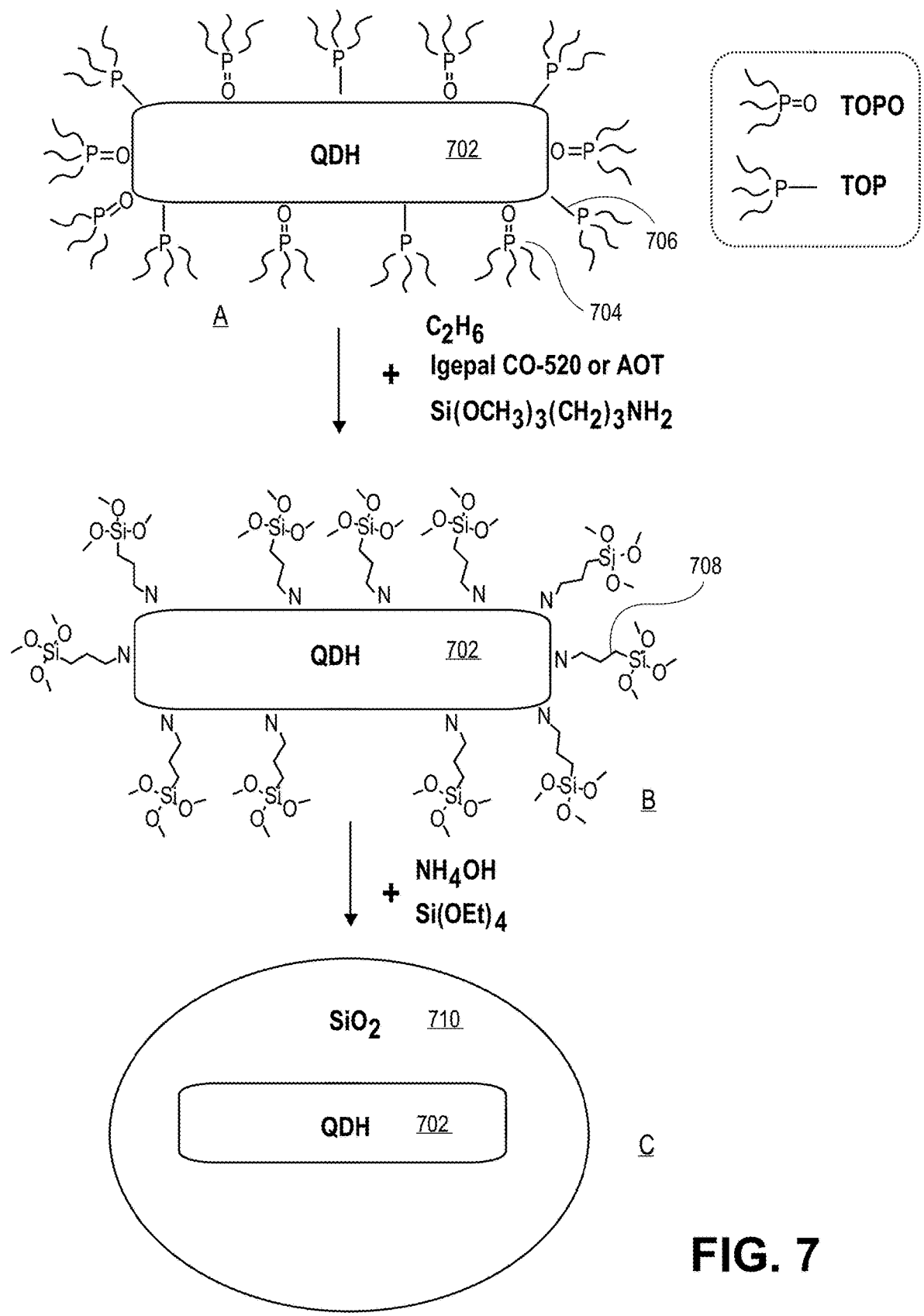
FIG. 7 illustrates operations in a reverse micelle approach to coating a semiconductor structure, in accordance with an embodiment of the present invention.
Figure 8:
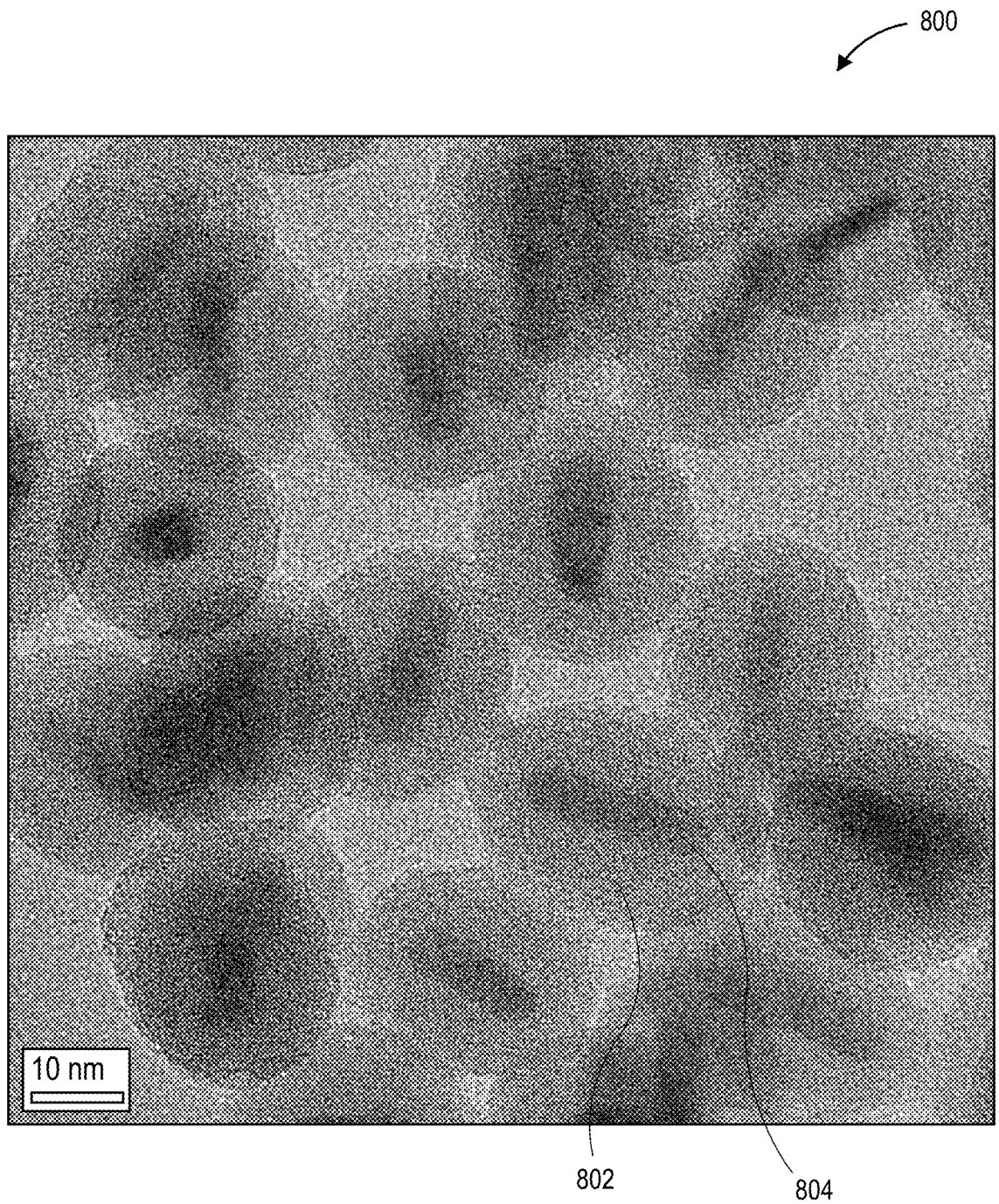
FIG. 8 is a transmission electron microscope (TEM) image of silica coated CdSe/CdS core/shell quantum dots having complete silica encapsulation, in accordance with an embodiment of the present invention.

Thus, semiconductor nanocrystals coated with silica according to the present invention may be made by a sol-gel reaction such as a reverse micelle method. As an example, FIG. 7 illustrates operations in a reverse micelle approach to coating a semiconductor structure, in accordance with an embodiment of the present invention. Referring to part A of FIG. 7, a quantum dot heterostructure (QDH) 702 (e.g., a nanocrystalline core/shell pairing) has attached thereto a plurality of TOPO ligands 704 and TOP ligands 706. Referring to part B, the plurality of TOPO ligands 704 and TOP ligands 706 are exchanged with a plurality of $Si(OCH_3)_3(CH_2)_3NH_2$ ligands 708. The structure of part B is then reacted with TEOS ($Si(OEt)_4$) and ammonium hydroxide ($NH_4OH$) to form a silica coating 710 surrounding the QDH 702, as depicted in part C of FIG. 7. FIG. 8 is a transmission electron microscope (TEM) image 800 of silica coated 802 CdSe/CdS core/shell quantum dots 804 having complete silica encapsulation, in accordance with an embodiment of the present invention. Thus, a reverse micelle is formed after adding ammonium hydroxide and tetraethylorthosilicate (TEOS), the source for the silica coating. TEOS diffuses through the micelle and is hydrolyzed by ammonia to form a uniform $SiO_2$ shell on the surface of the quantum dot. This approach may offer great flexibility to incorporate quantum dots of different sizes. In one such embodiment, the thickness of the insulator layer formed depends on the amount of TEOS added to the second solution.

With reference again to the above described method of forming coated nanocrystalline core and nanocrystalline shell pairings, in an embodiment, the first and second non-polar solvents are cyclohexane. In an embodiment, forming the coating layer includes forming a layer of silica and further includes using a combination of dioctyl sodium sulfosuccinate (AOT) and tetraorthosilicate (TEOS). In another embodiment, however, forming the layer includes forming a layer of silica and further includes using a combination of polyoxyethylene (5) nonylphenylether and tetraorthosilicate (TEOS). In another embodiment, however, forming the layer includes forming a layer of silica and further includes using cationic surfactants such as CTAB (cetyltrimethylammonium bromide), anionic surfactants, non-ionic surfactants, or pluronic surfactants such as Pluronic F 127 (an ethylene oxide/propylene oxide block co-polymer) as well as mixtures of surfactants.

Upon initiation of growth of a silica shell, the final size of that shell may be directly related to the amount of TEOS in the reaction solution. Silica coatings according to embodiments of the present invention may be conformal to the core/shell QDH or non-conformal. A silica coating may be between about 3 nm and 30 nm thick. The silica coating thickness along the c-axis may be as small as about 1 nm or as large as about 20 nm. The silica coating thickness along the a-axis may be between about 3 nm and 30 nm. Once silica shelling is complete, the product is washed with solvent to remove any remaining ligands. The silica coated quantum dots can then be incorporated into a polymer matrix or undergo further surface functionalization. However, silica shells according to embodiments of the present invention may also be functionalized with ligands to impart solubility, dispersability, heat stability and photo-stability in the matrix.

In another aspect, quantum dot composite compositions are described. For example, the quantum dots (including coated quantum dots) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down converting in LED applications.

Composites formed by conventional approaches typically suffer from non-uniform dispersion of quantum dots throughout the matrix material which can result in particle agglomeration. Agglomeration may be so severe as to result in emission quenching reducing light output. Another problem is lack of compatibility between the quantum dots and the matrix reduces composite performance. Lack of materials compatibility may introduce a discontinuity at the polymer/quantum dot interface where composite failure may initiate when it is deployed in ordinary use.

Accordingly, there remains a need for a composite material having a quantum dot composition in a matrix that is strong, resistant to thermal degradation, resistant to chemical degradation, provides good adhesion between the coated quantum dot and coupling agent and provides good adhesion between the coupling agent and the polymer matrix. Embodiments described below include quantum dots incorporated into composite matrixes to produce high refractive index films having a high PLQY suitable for solid state device lighting including light emitting diodes.

In an embodiment, an approach for incorporating quantum dots into matrix materials includes coating the quantum dot with a silica shell and reacting the silica shell with a silane coupling agent having two reactive functionalities under the proper conditions. Such an arrangement drives a condensation reaction, binding one end of the silane to the silica surface and leaving the other end of the molecule exposed for integration into a matrix. Other approaches include using a curable material such as metal oxide nanocrystals in a matrix material. In the curable material, metal oxide nanocrystals are linked to a polymer matrix via titanate or a zirconate coupling agents as well as a silane coupling agent, where the metal atoms of the coupling agent link to the oxygen atoms of the metal oxide nanocrystals. Since metal oxides generally do not have a higher refractive index, the curable material incorporating the metal oxide nanocrystals typically can not achieve a refractive index sufficient to improve the light extraction efficiency of photons emitted by an LED in a solid-state device. A high refractive index material including zinc sulfide (ZnS) in a matrix material is another approach attempted. In making the high refractive index material, ZnS colloids are synthesized with ligands having hydroxyl functional groups that are linked to isocyanate function groups present on an oligomer backbone in the matrix material.

In a general embodiment, a composite includes a matrix material. A plurality of semiconductor structures (e.g., quantum dot structures having a coated or non-coated core/shell pairing, such as the structures described above) is embedded in the matrix material. In an embodiment, a lighting apparatus includes a light emitting diode and a composite coating the light emitting diode. The composite may be formed by embedding quantum dots in a matrix material described below.

With reference to the above described composite, in an embodiment, each of the plurality of semiconductor structures is cross-linked with, polarity bound by, or tethered to the matrix material. In an embodiment, each of the plurality of semiconductor structures is bound to the matrix material by a covalent, dative, or ionic bond. By way of example, FIGS. 9A-9C illustrate schematic representations of possible composite compositions for quantum dot integration, in accordance with an embodiment of the present invention.

Figure 9A:
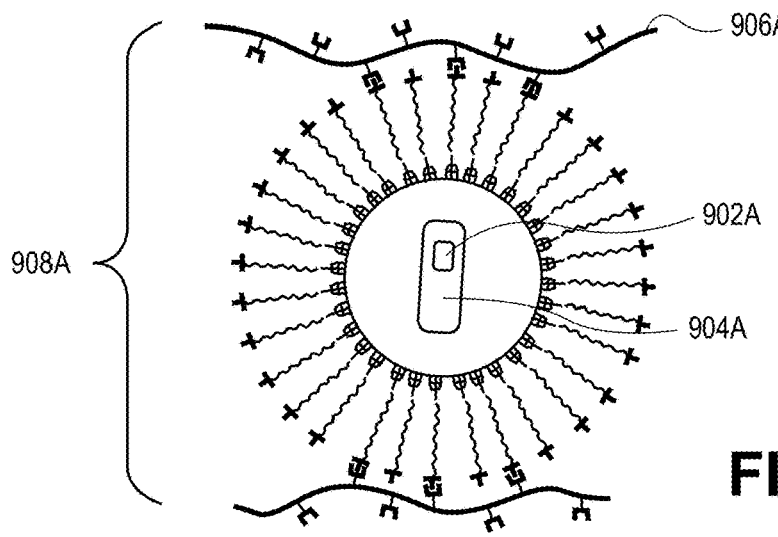
FIGS. 9A-9C illustrate schematic representations of possible composite compositions for quantum dot integration, in accordance with an embodiment of the present invention.
Figure 9B:
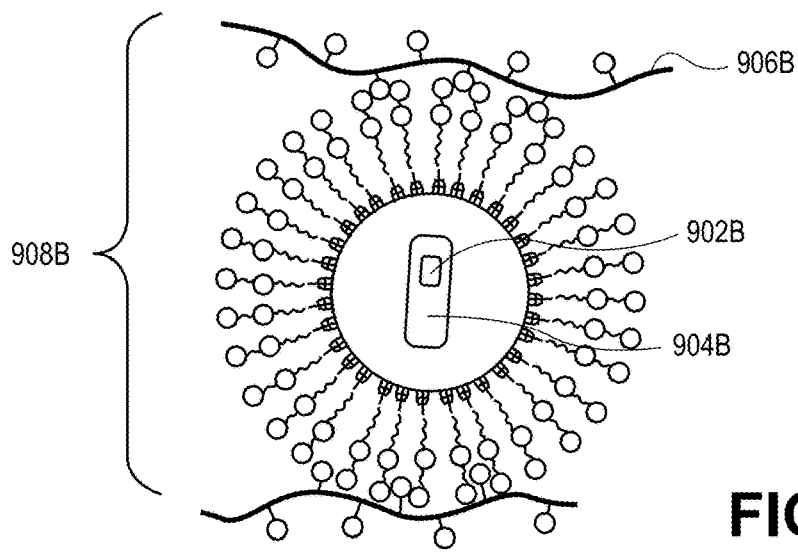
Figure 9C:
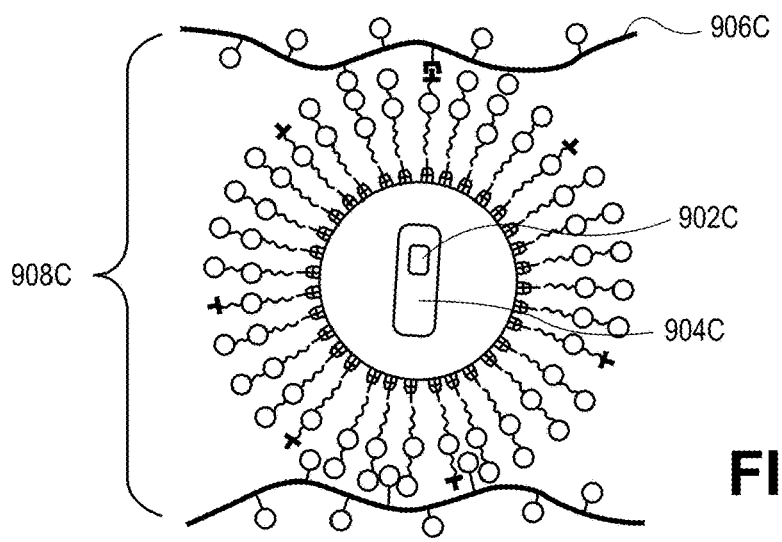

Referring to FIG. 9A, a nanocrystalline core 902A and shell 904A pairing is incorporated into a polymer matrix 906A by active cross-linking through multiple and interchain binding to form a cross-linked composition 908A. Referring to FIG. 9B, a nanocrystalline core 902B and shell 904B pairing is incorporated into a polymer matrix 906B by polarity-based chemical similarity and dissolution to form a polarity based composition 908B. Referring to FIG. 9C, a nanocrystalline core 902C and shell 904C pairing is incorporated into a polymer matrix 906C by reactive tethering by sparse binding and chemical similarity to form a reactive tethering based composition 908C.

With reference again to the above described composite, in an embodiment, one or more of the semiconductor structures further includes a coupling agent covalently bonded to an outer surface of the insulator layer. For example, in one such embodiment, the insulator layer includes or is a layer of silica ($SiO_x$), and the coupling agent is a silane coupling agent, e.g., having the formula $X_nSiY_{4-n}$, where X is a functional group capable of bonding with the matrix material and is one such as, but not limited to, hydroxyl, alkoxy, isocyanate, carboxyl, epoxy, amine, urea, vinyl, amide, aminoplast and silane, Y is a functional group such as, but not limited to, hydroxyl, phenoxy, alkoxy, hydroxyl ether, silane or aminoplast, and n is 1, 2 or 3. In another embodiment, however, the coupling agent is one such as, but not limited to, a titanate coupling agent or a zirconate coupling agent. It is to be understood that the terms capping agent, capping ligand, ligand and coupling agent may be used interchangeably as described above and, generally, may include an atom, molecule or other chemical entity or moiety attached to or capable of being attached to a nanoparticle. Attachment may be by dative bonding, covalent bonding, ionic bonding, Van der Waals forces or other force or bond.

In the case that a silica surface of a silica coated quantum dot is modified using silane coupling agents having multiple functional moieties, coupling to the surface of the silica shell and coupling to a matrix material and/or other matrix additives may be enabled. Such an approach provides dispersed uniformly throughout the composite matrix using as little effort (e.g., reaction energy) as possible. Stronger physical and/or chemical bonding between the silica coated quantum dots and the matrix resin occurs. Also, the silane coupling composition must be compatible with both the silica coated quantum dot, which is inorganic, and the polymer matrix, which may be organic. Without being bound by any particular theory or principle, it is believed that the silane coupling agent forms a bridge between the silica and the matrix resin when reactive functional groups on the silane coupling agent interact with functional groups on the surface of the silica and/or the matrix resin. Because the functional groups involved are typically polar in nature, the coupling agent tends to be hydrophilic and readily dispersed in an aqueous size composition.

Matrix materials suitable for embodiments of the present invention may satisfy the following criteria: they may be optically clear having transmission in the 400-700 nm range of greater than 90%, as measured in a UV-Vis spectrometer. They may have a high refractive index between about 1.0 and 2.0, preferably above 1.4 in the 400-700 nm range. They may have good adhesion to an LED surface if required and/or are sufficiently rigid for self-supporting applications. They may able to maintain their properties over a large temperature range, for example −40° C. to 150° C. and over a long period of time (over 50,000 hours at a light intensity typically 1-10 w/cm2 of 450 nm blue light).

Thus, with reference again to the above described composite, in an embodiment, the insulator layer is composed of a layer of silica ($SiO_x$), and the matrix material is composed of a siloxane copolymer. In another embodiment, the matrix material has a UV-Vis spectroscopy transmission of greater than 90% for light in the range of 400-700 nanometers. In an embodiment, the matrix material has a refractive index approximately in the range of 1-2 for light in the range of 400-700 nanometers. In an embodiment, the matrix material is thermally stable in a temperature range of −40-250 degrees Celsius. In an embodiment, the matrix material is composed of a polymer such as, but not limited to, polypropylene, polyethylene, polyesters, polyacetals, polyamides, polyacrylamides, polyimides, polyethers, polyvinylethers, polystyrenes, polyoxides, polycarbonates, polysiloxanes, polysulfones, polyanhydrides, polyamines, epoxies, polyacrylics, polyvinylesters, polyurethane, maleic resins, urea resins, melamine resins, phenol resins, furan resins, polymer blends, polymer alloys, or mixtures thereof. In one such embodiment, the matrix material is composed of a polysiloxane such as, but not limited to, polydimethylsiloxane (PDMS), polymethylphenylsiloxane, polydiphenylsiloxane and polydiethylsiloxane. In an embodiment, the matrix material is composed of a siloxane such as, but not limited to, dimethylsiloxane or methylhydrogen siloxane.

Additionally, with reference again to the above described composite, in an embodiment, the plurality of semiconductor structures is embedded homogeneously in the matrix material. In an embodiment, the composite further includes a compounding agent embedded in the matrix material. The compounding agent is one such as, but not limited to, an antioxidant, a pigment, a dye, an antistatic agent, a filler, a flame retardant, an ultra-violet (UV) stabilizer, or an impact modifier. In another embodiment, the composite further includes a catalyst embedded in the matrix material, the catalyst one such as, but not limited to, a thiol catalyst or a platinum (Pt) catalyst.

Accordingly, in an embodiment, a method of fabrication includes forming a plurality of semiconductor structures embedded the semiconductor structures in a matrix material (or embedding preformed semiconductor structures in a matrix material). In one such embodiment, embedding the plurality of semiconductor structures in the matrix material includes cross-linking, reactive tethering, or ionic bonding the plurality of semiconductor structures with the matrix material. In an embodiment, the method further includes surface-functionalizing an insulator layer for the semiconductor structures prior to embedding the plurality of semiconductor structures in the matrix material. In one such embodiment, the surface-functionalizing includes treating the insulator layer with a silane coupling agent. However, in an alternative embodiment, coated semiconductor structures are embedded in a matrix by using a ligand-free insulator layer.

In another embodiment, simple substitution at the surface of the silica coated quantum dots is effective for stable integration without undesired additional viscosity and is suitable to produce a low-viscosity product such as a silicone gel. In one embodiment of the present invention a composite incorporates quantum dots which crosslink with the matrix through silane groups and which possess an adequate number of silane groups in order to form an elastic network. In addition, adequate adhesion to various substrates is enabled. Furthermore, silicone-based matrixes may be used. A structure of such polymers may be obtained which form microstructures in the crosslinked composition, thereby yielding cross-linked polymer compounds with an excellent mechanical strength. Furthermore, because of the distribution of the reactive silane groups, a high elasticity may be obtained after cross-linking.

Exemplary Sythetic Procedures

Example 1: Synthesis of CdSe core nanocrystals. 0.560 g (560 mg) of ODPA solid was added to a 3-neck 25 ml round-bottom flask and 6 g TOPO solid was added to the flask. 0.120 g (120 mg) of CdO solid was added to the flask. With the flask sealed and the reagents inside (CdO, ODPA, TOPO), heat the reaction to 120° C. under flowing UHP Argon gas. When the reaction mixture becomes liquid, begin stirring at 800 RPM to completely distribute the CdO and ODPA. When the temperature equilibrates at around 120° C., begin degassing the reaction mixture: Standard degas is for 30 minutes at as low a vacuum as the system can maintain, preferably between 10-30 torr. After the first degas, switch the reaction back to flowing UHP Argon gas. The temperature of the reaction was raised to 280° C. to dissociate the CdO. Dissociation is accompanied by a loss of the typical red color for CdO. After dissociation of the CdO, cool the reaction to 120° C. for the 2nd degassing step. Preferably this step is done slowly. In one embodiment this is done in increments of 40 degrees and allowed to equilibrate at each step. When the reaction mixture has cooled to about 120° C., begin the second degassing step. The second degassing is typically 1 hour at the lowest vacuum level possible. After the second degassing, switch the reaction back to flowing UHP Argon. Heat the reaction mixture. Inject 3.0 g TOP into the reaction solution as temperature increases above 280° C. Equilibrate the reaction solution at 370° C. When the reaction is equilibrated at 370° C., inject 0.836 g of 14% Se:TOP stock solution into the solution. The reaction is run until the desired visible emission from the core is achieved. For CdSe cores the time is usually between 0.5 and 10 minutes. To stop the reaction: while continuing to stir and flow UHP Argon through the reaction, rapidly cool the solution by blowing nitrogen on the outside of the flask. When the reaction temperature is around 80° C., expose the reaction solution to air and inject approximately 6 mL of toluene. Precipitate the CdSe nanocrystals through the addition of 2-propanol (IPA) to the reaction solutions. Preferably the mixture should be approximately 50/50 (by volume) reaction solution/IPA to achieve the desired precipitation. Centrifuge for 5 minutes at 6000 RPM. Redissolve the CdSe in as little toluene as possible solid (<2 mL). Precipitate the CdSe again using IPA. Centrifuge. Decant the supernatant liquid. Dissolve the CdSe solid in anhydrous toluene.

Example 2: Synthesis of CdSe/CdS core-shell nanocrystal heterostructures having PLQY>90%. Transfer 0.290 g (290 mg) of ODPA into a round bottom flask. Transfer 0.080 g (80 mg) of hexylphosphonic acid (HPA) into the flask. Transfer 3 g TOPO into the flask. Transfer 0.090 g (90 mg) of CdO solid into the reaction flask. With the flask sealed and the reagents inside (CdO, ODPA, TOPO, HPA), heat the reaction to 120° C. under flowing UHP Argon gas. When the reaction mixture becomes liquid, at about 60° C., begin stirring at 800 RPM to completely distribute the CdO, ODPA, and HPA. When the temperature settles at 120° C., begin degassing the reaction mixture. After the degas step, switch the reaction back to flowing UHP Argon gas. Raise the temperature of the reaction to 280° C. to dissociate the CdO. Increase the temperature set-point of the reaction to 320° C. Inject 1.5 g TOP into the reaction solution as temperature increases above 280° C. When the reaction is equilibrated at 320° C., inject a mixture of 1.447 g of 7.4% S:TOP stock solution and 0.235 g concentration-adjusted CdSe seed stock into the reaction solution. Immediately reduce the set point of the temperature controller to 300° C. Allow the reaction to proceed for the requisite time to necessary to produce the desired length and width of shell, yielding a rod having an aspect ratio as between 1.5 and 10, more preferably between 3 and 6. Reaction temperature for shell growth is between 120° C. and 380° C., preferably between 260° C. and 320° C., more preferably between 290° C. and 300° C.

The reaction is monitored by testing a sample to determine the absorbance at 400 nm and the at the CdSe exciton peak. Most preferably the reaction is stopped when the absorbance at 400 nm divided by the absorbance at the CdSe exciton peak is between about 25-30, but the invention contemplates that the absorbance ratio may be between about 6 and about 100, preferably between about 15-35. By "stopping the growth" it is meant that any method steps may be employed known in the art if desired and available to cease the growth of the shell. Some methods will lead to quicker cessation of shell growth than others.

Absorbance measuring may be performed by UV-VIS spectroscopic analytical method, such as a method including flow injection analysis for continuous monitoring of the reaction. In an embodiment, the reaction is stopped or arrested by removing a heating mantle and allowing the reaction vessel to cool. When the reaction temperature is around approximately 80 degrees Celsius, the reaction solution is exposed to air and approximately 4-6 mL of toluene is injected. The quantum dots are purified by transferring the reaction solution into four small centrifuge tubes, so that an equal volume is in each tube. The QDH product is precipitated through the addition of 2-propanol (WA) to the reaction solutions. Following centrifuging, the supernatant liquid is decanted. The QDH is redissolved in as little toluene as possible (e.g., less than approximately 2 mL) and re-concentrated into one centrifuge tube. The precipitation and centrifugation steps are repeated. The final solid product is then dissolved in approximately 2 g of toluene.

Figure 10:
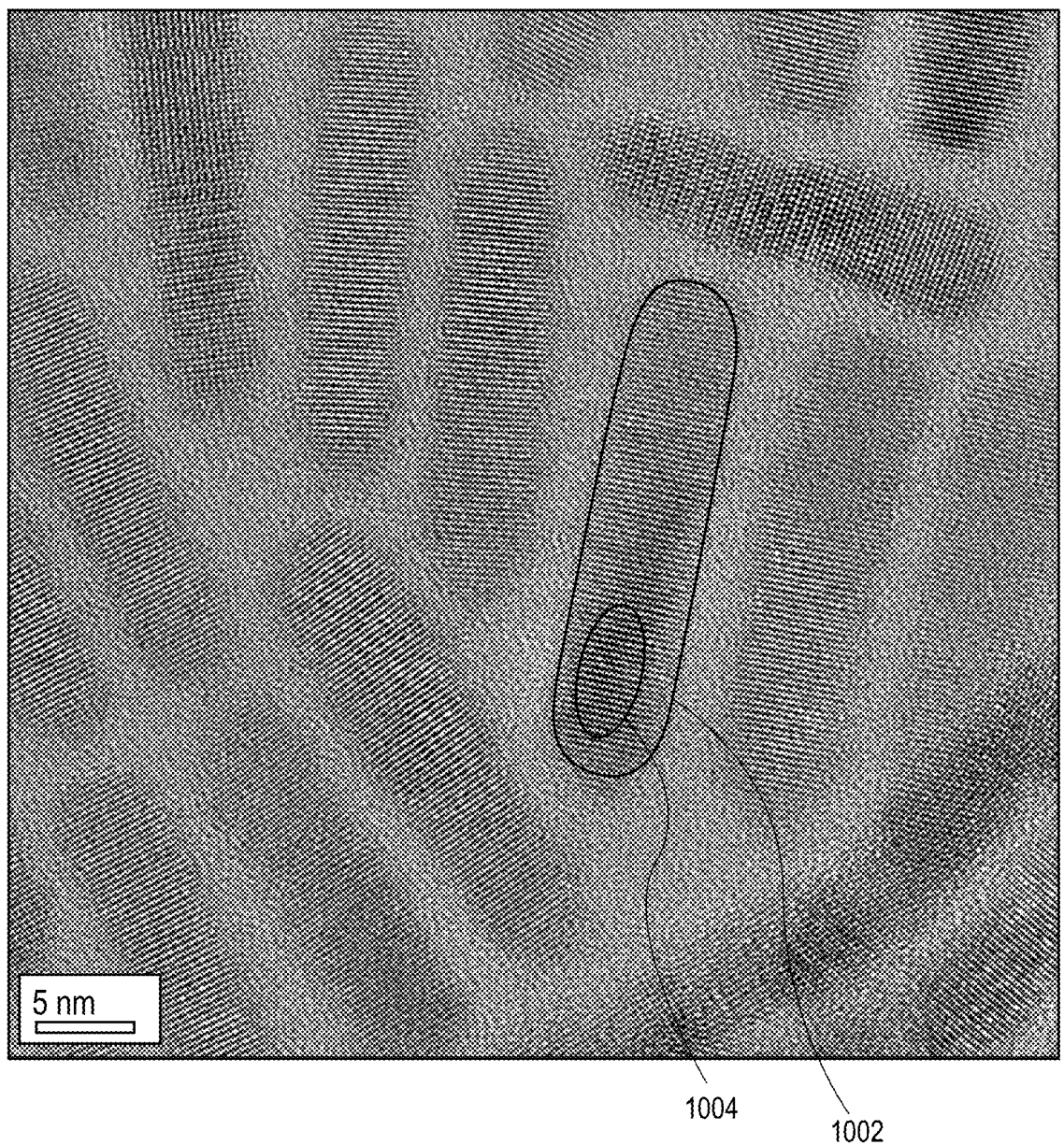
FIG. 10 is a transmission electron microscope (TEM) image of a sample of core/shell CdSe/CdS quantum dots, in accordance with an embodiment of the present invention.

Example 3: Synthesis of CdSe/CdS quantum dot having an absorbance ratio between 6-100. A quantum dot was fabricated according to Example 2 and having an absorbance ratio between 6-100. FIG. 10 is a transmission electron microscope (TEM) image 1000 of a sample of core/shell (1002/1004) CdSe/CdS quantum dots, in accordance with an embodiment of the present invention. The TEM image 1000 indicates that there are substantially no structural defects as can be deduced from the low density of stacking faults and lack of other visible defects along the semiconductor structure 1002/1004.

Figure 11:
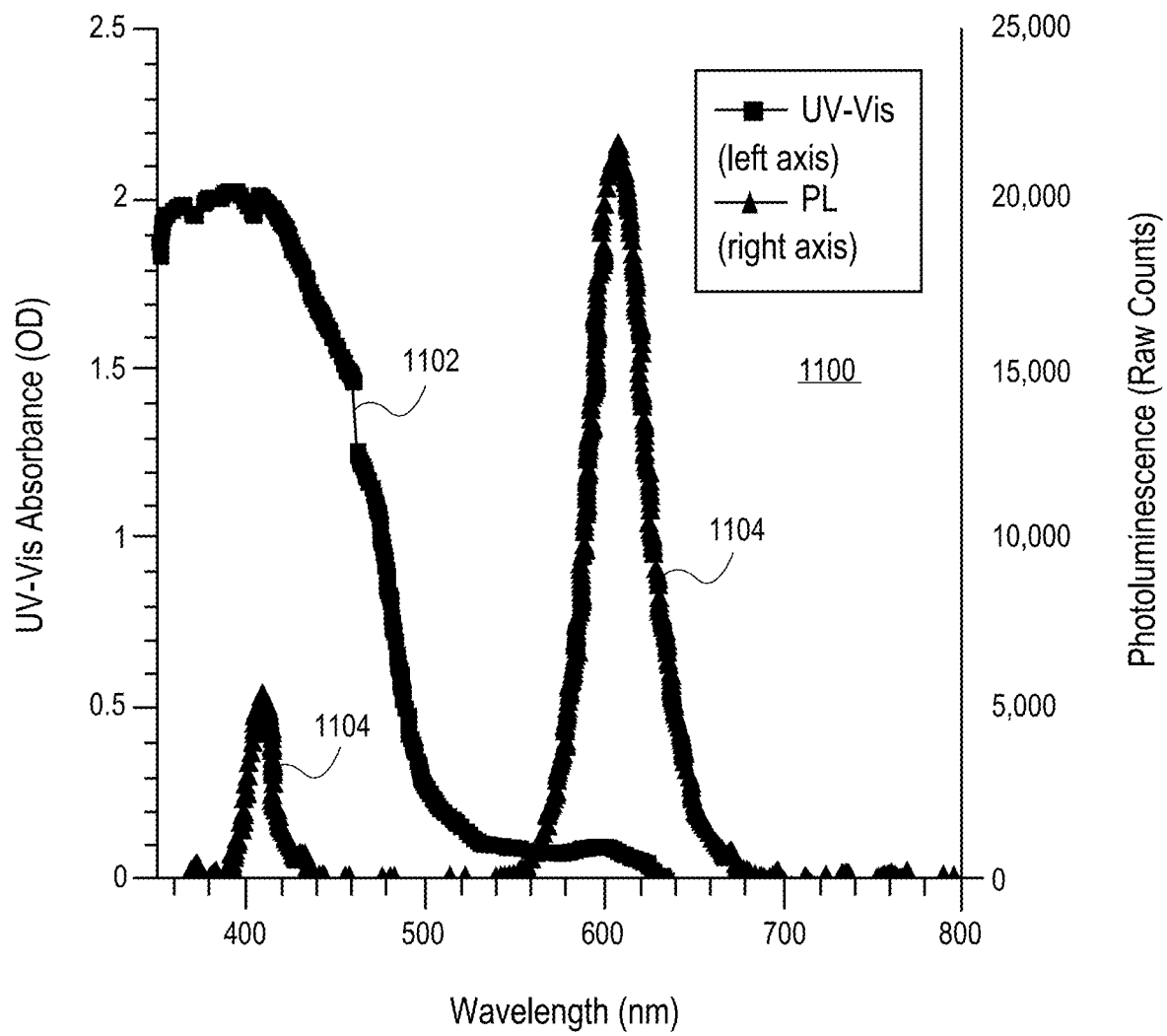
FIG. 11 is a plot including a UV-Vis absorbance spectrum and photoluminescent emission spectrum for a CdSe/CdS core/shell quantum dot having a PLQY of 96%, in accordance with an embodiment of the present invention.
Figure 12:
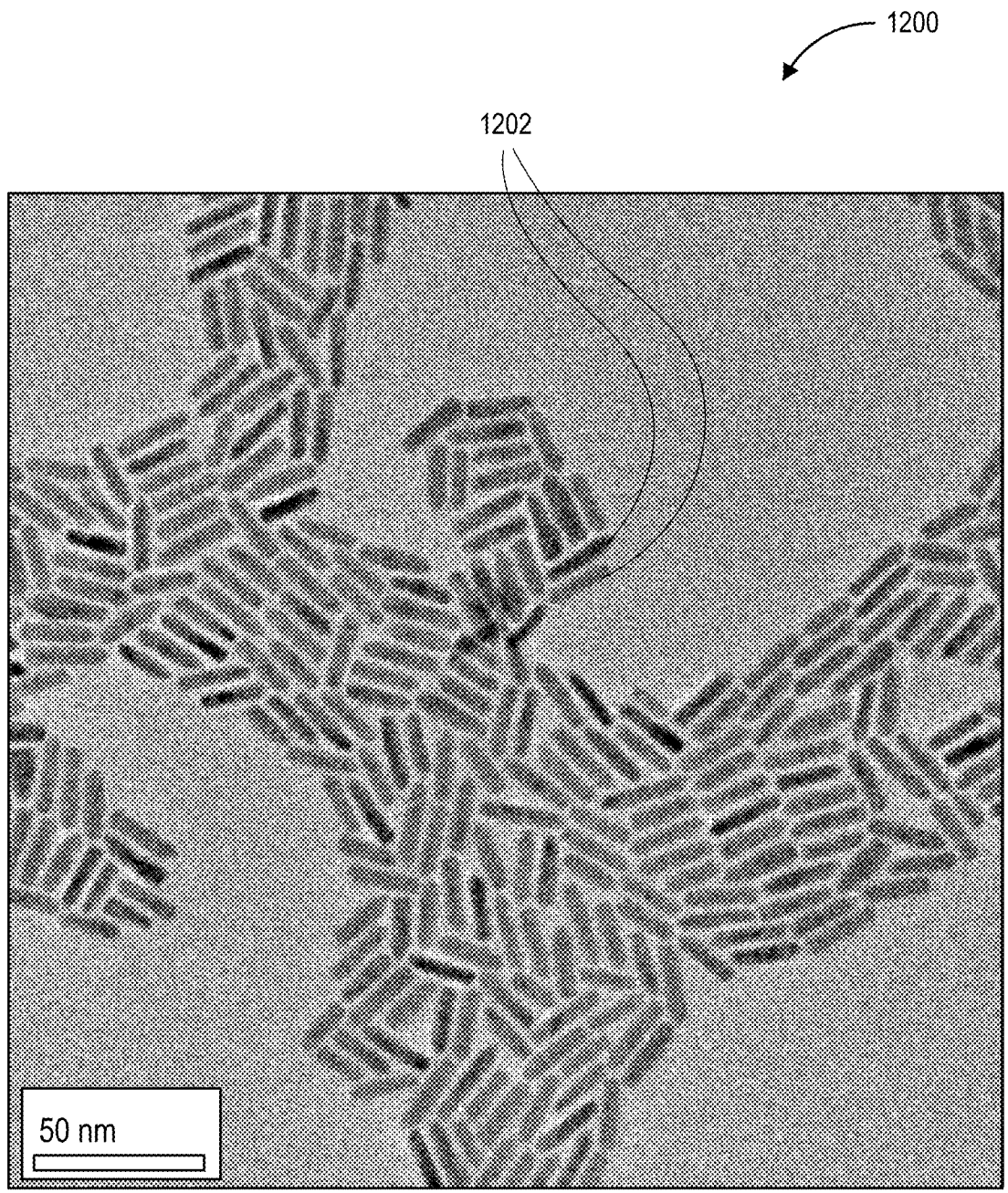
FIG. 12 is a transmission electron microscope (TEM) image of a sample of CdSe/CdS quantum dots having a PLQY of 96%, in accordance with an embodiment of the present invention.

Example 4: Synthesis of CdSe/CdS red quantum dot with a PLQY=96%. Quantum dots were fabricated according to Example 2 and having an absorbance ratio between 6-100, and having a PLQY of 96% at 606 nm. The average length (from TEM data) is 22.3 nm±3.1 nm. The average width (from TEM data) is 6.0 nm±0.6 nm. The average aspect ratio (from TEM data) is 3.8±0.6. FIG. 11 is a plot 1100 including a UV-Vis absorbance spectrum 1102 and photoluminescent emission spectrum 1104 for a CdSe/CdS core/shell quantum dot having a PLQY of 96%, in accordance with an embodiment of the present invention. The quantum dot has essentially no overlapping absorption and emission bands. FIG. 12 is a transmission electron microscope (TEM) image 1200 of a sample of CdSe/CdS quantum dots 1202 fabricated according to example 4, in accordance with an embodiment of the present invention.

Example 5: Reactive Ligand Exchange for quantum dot structures. 0.235 g of concentration-adjusted CdSe stock from Example 2 are exposed to a reactive exchange chemical, trimethylsilylpyrollidine (TMS-Pyr), for 20 minutes in an air-free environment and are mixed completely. After 20 minutes, an alcohol, usually 2-propanol or methanol is added to the mixture to quench the reactivity of the TMS-Pyr reagent, and to precipitate the reactively exchanged CdSe particles. The precipitated particles are centrifuged at 6000 RPM for 5 minutes. The resulting supernatant liquid is decanted and the precipitate are re-dissolved in 0.235 g of anhydrous toluene for use in the procedure described in Example 2. Reactive ligand exchange is used to introduce any number of desired surface functionalities to the surface of quantum dot cores prior to rod growth or the surface of the core/shell particles after synthesis.

Example 6: Coating semiconductor nanocrystalline core/shell pairing with silica using dioctyl sodium sulfosuccinate (AOT). Approximately 4.5 g of AOT is dissolved in 50 mL of cyclohexane. 0.5 g of QDH is precipitated w/methanol, and then re-dissolved in hexane. 20 µL of 3-aminopropyltrimethoxysilane (APTMS) is added and stirred for 30 minutes. 900 µL of NH4OH (29 wt %) is added into the solution immediately followed by 600 µL of TEOS. The solution is stirred for about 16 hrs which allows the mixture to react until a silica shell coats the nanocrystal. The silica coated particles are precipitated by MeOH and the precipitated particles are separated from the supernatant using a centrifuge. The $SiO_2$ coated particles can be re-dispersed in toluene or left in cyclohexane.

Example 7: Coating a semiconductor nanocrystal with silica using IGEPAL CO-520. Approximately 4.46 g of Igepal CO-520 (Polyoxyethylene (5) nonylphenylether) is dissolved in 50 mL of cyclohexane and allowed to mix. "n" may be 3, 4, 5, 6, 7, 8, 9 or 10, preferably about 5. 0.5 grams of quantum dots dissolved in toluene are added. 20 µL of 3-APTMS is added and stirred for about 30 minutes. 900 µL of $NH_4OH$ (29 wt %) is added into the solution immediately followed by 600 µL of TEOS. The solution is stirred for about 16 hrs at 1600 rpm which allows the mixture to react until a silica shell coats the nanocrystal. The micelles are broken up by IPA and collected using a centrifuge. The $SiO_2$ coated particles may be re-dispersed in toluene or left in cyclohexane for polymer integration.

Example 8: Methoxy silane coupling agent. Silica-shelled core-shell quantum dots are dispersed in 20 parts toluene to 1 part (MeO)3 SiR (R=allyl or vinyl), and constantly stirred to allow the coupling reaction to take place. The functionalized particles are separated and cleaned by precipitation with IPA and centrifugation at 6000 rpm for 10 min. The process is repeated two or more times. Cleaned particles are dispersed in a known amount of toluene or polymer solution.

Example 9: Quantum dot/polymer preparation. To prepare the films, a known mass of quantum dots in toluene or cyclohexane is added to premade polymer solution, depending on solvent compatibility of the polymer matrix used. Other solvents may also be used for dissolution, if so desired for polarity match with the matrix or to increase or decrease the viscosity or rate of solvent evolution from the cast film.

Example 10: Film casting. The composite compositions are prepared by drop casting approximately 360 µL of QDH polymer solution onto a 12 mm glass round. The amount of quantum dots added to the polymer solution can be adjusted for different optical densities in the final QDH film. After casting films, the slow evaporation of solvent is important to give a film free of large surface imperfections. QDH-polymer solutions in toluene are allowed to evaporate in a vented fume hood. The films are cast on a level stainless plate. Once films are dried they are analyzed for PLQY and UV-Vis properties.

Example 11: The surface of silica-shelled quantum dot was functionalized using a variety of methoxy and ethoxy silanes: $(MeO)_3SiAllyl$, $(MeO)_3SiVinyl$, $(MeO)_2SiMeVinyl$, $(EtO)_3SiVinyl$, $EtOSi(Vinyl)_3$. The functionalized silica-shelled quantum dot was then used in the standard polymer formulation with additives for crosslinking, as well as without any further crosslinking co-agents such as TAIC in the case of EVA or divinylsilanes for siloxanes.

Example 12: In one embodiment, it is preferred that the olefin group is able to participate in a crosslinking process through radical mechanism in the case of EVA or through hydrosilylation process in the case of siloxanes. Allyl and vinyl are preferred, but other olefins can be included.

Example 13: In one embodiment, the degree of crosslinking may be increased using quantum dots with a higher density of the olefin groups on silica surface of quantum dots.

Example 14: Using polarity. The surface of a silica-shelled particle is modified with organo-substituted silanes in order to maximize the compatibility with a polymer matrix such as the polysiloxanes for LEDs. The silica surface is modified with organo-substituted silanes, and its properties are therefore modified by the grafted functional groups.

Example 15: Pt catalyst. A platinum-based catalyst may be introduced in Examples 9-14. In addition to the functionalized silica particles, two competing or complementary catalysts are available for cross-linking.

Example 16: Thiol catalyst. The Pt catalyst of example 15 is replaced with a thiol catalyst with a thiol-ene reaction. Di-thiols or multifunctional thiols are used. The approach enables UV curing in place of heat curing.

Thus, composites having semiconductor structures embedded in a matrix have been disclosed. In accordance with an embodiment of the present invention, a composite includes a matrix material. A plurality of semiconductor structures is embedded in the matrix material. Each semiconductor structure includes an anisotropic nanocrystalline core composed of a first semiconductor material and having an aspect ratio between, but not including, 1.0 and 2.0. Each semiconductor structure also includes a nanocrystalline shell composed of a second, different, semiconductor material at least partially surrounding the anisotropic nanocrystalline core. An insulator layer encapsulates each nanocrystalline shell and anisotropic nanocrystalline core pairing. In one embodiment, the anisotropic nanocrystalline core and the nanocrystalline shell form a quantum dot.

What is claimed is:

1. A method of fabricating a semiconductor structure, the method comprising:
    forming an anisotropic nanocrystalline core comprising a first semiconductor material;
    forming an anisotropic nanocrystalline shell from a second, different, semiconductor material to completely surround the anisotropic nanocrystalline core,
    wherein the anisotropic nanocrystalline core, and the anisotropic nanocrystalline shell form a quantum dot;
    forming an insulator layer encapsulating the anisotropic nanocrystalline shell and anisotropic nanocrystalline core to form a coated quantum dot;
    covalently bonding a coupling agent to an outer surface of the insulator layer; and
    embedding the coated quantum dot in a matrix material, wherein the coated quantum dot is incorporated into the matrix material by cross-linking through multiple and inter-chain binding to form a cross-linked semiconductor structure, or the coated quantum dot is incorporated into the matrix material by polarity-based chemical similarity and dissolution to form a polarity based semiconductor structure, or the coated quantum dot is incorporated into the matrix material by reactive tethering by sparse binding and chemical similarity to form a reactive tethering based semiconductor structure.

2. The method of claim 1, wherein forming the insulator layer comprises bonding the insulator layer directly to the anisotropic nanocrystalline shell.

3. The method of claim 2, wherein bonding the insulator layer directly to the anisotropic nanocrystalline shell comprises passivating an outermost surface of the anisotropic nanocrystalline shell.

4. The method of claim 1, wherein forming the insulator layer comprises providing a barrier for the anisotropic nanocrystalline shell and anisotropic nanocrystalline core impermeable to an environment outside of the insulator layer.

5. The method of claim 1, wherein forming the insulator layer comprises encapsulating only a single anisotropic nanocrystalline shell/anisotropic nanocrystalline core pairing.

6. The method of claim 4, wherein forming the insulator layer comprises forming a layer of material selected from the group consisting of silica (SiOx), titanium oxide (TiOx), zirconium oxide (ZrOx) and alumina (AlOx).

7. The method of claim 6, wherein forming the layer comprises forming a layer of silica and further comprises using a reverse micelle sol-gel reaction.

8. The method of claim 7, wherein using the reverse micelle sol-gel reaction comprises dissolving the anisotropic nanocrystalline shell/nanocrystalline core pairing in a first non-polar solvent to form a first solution and, subsequently, adding the first solution along with a species selected from the group consisting of 3-aminopropyltrimethoxysilane (APTMS), 3-mercapto-trimethoxysilane, and a silane comprising a phosphonic acid or carboxylic acid functional group, to a second solution comprising a surfactant dissolved in a second non-polar solvent and, subsequently, adding ammonium hydroxide and tetraorthosilicate (TEOS) to the second solution.

9. The method of claim 8, wherein the thickness of the insulator layer formed depends on the amount of TEOS added to the second solution.

10. The method of claim 8, wherein the first and second non-polar solvents are cyclohexane.

11. The method of claim 6, wherein forming the layer comprises forming a layer of silica and further comprises using a combination of dioctyl sodium sulfosuccinate (AOT) and tetraorthosilicate (TEOS).

12. The method of claim 6, wherein forming the layer comprises forming a layer of silica and further comprises using a combination of polyoxyethylene (5) nonylphenylether and tetraorthosilicate (TEOS).

13. The method of claim 1, wherein forming the insulator layer comprises forming the insulator layer to have a ligand-free outer surface.

14. The method of claim 1, further comprising: ligand-functionalizing an outer surface of the insulator layer.

15. The method of claim 14, wherein ligand-functionalizing the outer surface of the insulator layer comprises treating the semiconductor structure with a ligand selected from the group consisting of mono-, di-, or tri- alkoxysilanes with three, two or one inert or organofunctional substituents of the general formula (R1O)3SiR2; (R1O)2SiR2R3; (R1O)SiR2R3R4, where R1 is methyl, ethyl, propyl, isopropyl, or butyl, R2,R3 and R4 are identical or different and are H substituents, alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a silane with the general structure (R1O)3Si—(CH2)n-R—(CH2)n-Si(RO)3 where R and R1 is H or an organic substituent selected from the group consisting of alkyls, alkenes, alkynes, aryls, halogeno-derivatives, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a chlorosilane, and an azasilane.

16. The method of claim 14, wherein ligand-functionalizing the outer surface of the insulator layer comprises imparting solubility, dispersability, heat stability, photostability, or a combination thereof, to the semiconductor structure.

17. The method of claim 1, wherein the anisotropic nanocrystalline core has an aspect ratio between, but not including, 1.0 and 2.0.

18. The method of claim 1, wherein the nanocrystalline shell has a center, wherein the nanocrystalline shell extends in a first direction along a first axis and the anisotropic nanocrystalline core is off-center with respect to the anisotropic nanocrystalline shell in the first direction along the first axis, wherein the nanocrystalline shell extends in a second direction along a second axis orthogonal to the first axis, and the anisotropic nanocrystalline core is further disposed off-center with respect to the anisotropic nanocrystalline shell in the second direction along the second axis.

19. The method of claim 18, wherein the nanocrystalline shell is longer in the first direction than in the second direction.

20. The method of claim 1, wherein the coupling agent is selected from the group consisting of a titanate coupling agent and a zirconate coupling agent.

21. A method of fabricating a semiconductor structure, the method comprising:

forming an anisotropic nanocrystalline core comprising a first semiconductor material;

forming an anisotropic nanocrystalline shell from a second, different, semiconductor material to completely surround the anisotropic nanocrystalline core, forming a nanocrystalline outer shell from a third semiconductor material, different from the second semiconductor material, to at least partially surround the nanocrystalline shell, wherein the anisotropic nanocrystalline core, the anisotropic nanocrystalline shell and the nanocrystalline outer shell form a quantum dot;

forming an insulator layer encapsulating the nanocrystalline outer shell, the anisotropic nanocrystalline shell, and the anisotropic nanocrystalline core to form a coated quantum dot;

covalently bonding a coupling agent to an outer surface of the insulator layer; and embedding the coated quantum dot in a matrix material, wherein the coated quantum dot is incorporated into the matrix material by cross-linking through multiple and inter-chain binding to form a cross-linked semiconductor structure, or the coated quantum dot is incorporated into the matrix material by polarity-based chemical similarity and dissolution to form a polarity based semiconductor structure, or the coated quantum dot is incorporated into the matrix material by reactive tethering by sparse binding and chemical similarity to form a reactive tethering based semiconductor structure.

22. The method of claim 21, wherein the coupling agent is selected from the group consisting of a titanate coupling agent and a zirconate coupling agent.

* * * * *